United States Patent
Uchino et al.

(10) Patent No.: US 12,332,056 B2
(45) Date of Patent: Jun. 17, 2025

(54) VIBRATING-TYPE GYROSCOPE ELEMENT AND ANGULAR VELOCITY SENSOR INCLUDING SAME

(71) Applicant: Sumitomo Precision Products Co., Ltd., Hyogo (JP)

(72) Inventors: Ryohei Uchino, Hyogo (JP); Takafumi Moriguchi, Hyogo (JP); Naoki Okimoto, Hyogo (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 277 days.

(21) Appl. No.: 18/002,961

(22) PCT Filed: Jun. 24, 2021

(86) PCT No.: PCT/JP2021/024034
§ 371 (c)(1),
(2) Date: Dec. 22, 2022

(87) PCT Pub. No.: WO2022/004563
PCT Pub. Date: Jan. 6, 2022

(65) Prior Publication Data
US 2023/0358539 A1  Nov. 9, 2023
US 2025/0137786 A9  May 1, 2025

(30) Foreign Application Priority Data
Jul. 3, 2020 (JP) .................. 2020-115612

(51) Int. Cl.
*G01C 19/5684* (2012.01)
*B81B 3/00* (2006.01)
(Continued)

(52) U.S. Cl.
CPC ........ *G01C 19/5684* (2013.01); *B81B 3/0086* (2013.01); *G01C 19/5719* (2013.01);
(Continued)

(58) Field of Classification Search
CPC ............ G01C 19/5684; G01C 19/5719; B81B 3/0086; B81B 2201/0242; B81B 2203/04; H10N 30/302
See application file for complete search history.

(56) References Cited

U.S. PATENT DOCUMENTS 6,343,509 B1 *  2/2002  Fell .................... G01C 19/5677
73/504.13
6,978,674 B2 * 12/2005  Fell .................... G01C 19/5677
73/504.13
(Continued)

FOREIGN PATENT DOCUMENTS

EP    3470784 A1    4/2019
EP    3779359 A1    2/2021
(Continued)

OTHER PUBLICATIONS

JP-2011027560-A, English Translation (Year: 2011).*
(Continued)

*Primary Examiner* — Ryan D Walsh
(74) *Attorney, Agent, or Firm* — Alston & Bird LLP

(57) ABSTRACT

A vibrating-type gyroscope element includes a fixed part, a resonator having a vibration mode of cos Nθ (N is a natural number of two or more), support parts, and electrodes. The electrodes are arranged in 4N orientations arranged in an outer circumferential direction of the resonator. The electrodes include at least one primary driving electrode and at least one secondary pickoff electrode. A relationship U≥1 or (S1+S2)−2≥|S1−S2| is satisfied, where S1 is the number of cases where a secondary pickoff electrode is clockwise adjacent to a primary driving electrode, S2 is the number of cases where a secondary pickoff electrode is anticlockwise adjacent to a primary driving electrode, and U is the number
(Continued)

of the secondary pickoff electrodes being neither clockwise nor anticlockwise adjacent to a primary driving electrode.

5 Claims, 22 Drawing Sheets

(51) Int. Cl.
    *G01C 19/5719*     (2012.01)
    *H10N 30/30*     (2023.01)

(52) U.S. Cl.
    CPC .... *H10N 30/302* (2023.02); *B81B 2201/0242* (2013.01); *B81B 2203/04* (2013.01)

(56) References Cited

U.S. PATENT DOCUMENTS

| | | | | |
|---|---|---|---|---|
| 8,375,792 | B2* | 2/2013 | Ikeda | G01C 19/5684 |
| | | | | 73/504.13 |
| 9,151,612 | B2* | 10/2015 | Araki | G01C 19/5677 |
| 2011/0167911 | A1 | 7/2011 | Fell et al. | |
| 2019/0041212 | A1 | 2/2019 | Baxter | |
| 2022/0123198 | A1* | 4/2022 | Townsend | B81B 3/0021 |
| 2023/0243653 | A1* | 8/2023 | Uchino | G01C 19/5684 |
| | | | | 73/504.12 |

FOREIGN PATENT DOCUMENTS

| | | | |
|---|---|---|---|
| JP | 2009-115559 | A | 5/2009 |
| JP | 2011-027561 | A | 2/2011 |
| JP | 2011027560 | A * | 2/2011 |
| JP | 5410518 | B2 | 2/2014 |
| JP | 2019-032302 | A | 2/2019 |
| WO | WO-2023079849 | A1 * | 5/2023 |

OTHER PUBLICATIONS

WO-2023079849-A1, English Translation (Year: 2023).*
International Search Report and Written Opinion for PCT/JP2021/024034 (ISR/JP) mailed Sep. 21, 2021 (9 pages).

* cited by examiner

FIG.13

| | CORRESPONDING FIGS | S1 | S2 | U | S1+S2 | S1−S2 | EXPRESSION (1) SATISFIED? | EXPRESSION (2) SATISFIED? | LEVEL OF ACTUAL CROSSTALK VOLTAGE AT GYROSCOPE ELEMENT | CROSSTALK VOLTAGE PER SPO |
|---|---|---|---|---|---|---|---|---|---|---|
| FIRST EMBODIMENT | FIG.6 | 4 | 4 | 0 | 8 | 0 | N | Y | 0 | 0 |
| COMPARATIVE EXAMPLE | FIG.7 | 2 | 0 | 0 | 2 | 2 | N | N | $2V_{spo}$ | $V_{spo}$ |
| FIRST MODIFICATION | FIG.8A | 3 | 3 | 0 | 6 | 0 | N | Y | 0 | 0 |
| FIRST MODIFICATION | FIG.8B | 2 | 2 | 0 | 4 | 0 | N | Y | 0 | 0 |
| FIRST MODIFICATION | FIG.8C | 3 | 2 | 0 | 5 | 1 | N | Y | $V_{spo}$ | $(1/3)V_{spo}$ |
| SECOND MODIFICATION | FIG.9A | 1 | 1 | 0 | 2 | 0 | N | Y | 0 | 0 |
| SECOND MODIFICATION | FIG.9B | 1 | 1 | 1 | 2 | 0 | Y | Y | 0 | 0 |
| THIRD MODIFICATION | FIG.10A | 1 | 1 | 0 | 2 | 0 | N | Y | 0 | 0 |
| THIRD MODIFICATION | FIG.10B | 1 | 1 | 1 | 2 | 0 | N | Y | 0 | 0 |
| FOURTH MODIFICATION | FIG.11A | 1 | 0 | 1 | 1 | 1 | Y | N | $V_{spo}$ | $(1/2)V_{spo}$ |
| FOURTH MODIFICATION | FIG.11B | 2 | 1 | 0 | 3 | 1 | N | Y | $V_{spo}$ | $(1/2)V_{spo}$ |
| FIFTH MODIFICATION | FIG.12A | 0 | 0 | 2 | 0 | 0 | Y | N | 0 | 0 |
| FIFTH MODIFICATION | FIG.12B | 0 | 0 | 2 | 0 | 0 | Y | N | 0 | 0 | ved with a plurality of electrodes on a surface of a ring-shaped resonator and configured to apply a magnetic field in a direction crossing surfaces of the electrodes (see, e.g., Japanese Patent No. 5410518 and Japanese Unexamined Patent Publication No. 2019-032302).

VIBRATING-TYPE GYROSCOPE ELEMENT AND ANGULAR VELOCITY SENSOR INCLUDING SAME

CROSS REFERENCE TO RELATED APPLICATIONS

This application is a National Stage Application, filed under 35 U.S.C. § 371, of International Application No. PCT/JP2021/024034, filed Jun. 24, 2021, which international application claims priority to and the benefit of Japanese Application No. 2020-115612, filed Jul. 3, 2020; the contents of both of which as are hereby incorporated by reference in their entireties.

BACKGROUND

Technical Field

The present disclosure relates to a vibrating-type gyroscope element and an angular velocity sensor including the vibrating-type gyroscope element.

Description of Related Art

Vibrating-type gyroscope elements have been known as gyroscope elements for use in an angular velocity sensor. For example, electromagnetic gyroscope elements have been well-known, which have such a structure that is provided with a plurality of electrodes on a surface of a ring-shaped resonator and configured to apply a magnetic field in a direction crossing surfaces of the electrodes (see, e.g., Japanese Patent No. 5410518 and Japanese Unexamined Patent Publication No. 2019-032302).

The electromagnetic gyroscope elements are so configured that, under the magnetic field application, the resonators are vibrated by resonance vibration (which may be also referred to as first order vibration hereinafter) caused by a current of a frequency equivalent to a resonance frequency of the resonator applied via some of the electrodes (hereinafter referred to as primary driving electrodes). If an angular velocity occurs when the resonator receives a Coriolis force, a voltage generated at other electrodes (hereinafter referred to as a secondary pickoff electrode) is detected as a signal for calculating an angular velocity.

BRIEF SUMMARY

In a case where the primary driving electrode and the secondary pickoff electrode are close to each other in distance, mutual induction is caused at the secondary pickoff electrode due to an AC current flowing in the primary driving electrode, and as a result, a voltage (hereinafter sometimes referred to as a crosstalk voltage) might be induced.

Such a crosstalk voltage is, as an error component, superimposed on an output signal, leading to an error in an angular velocity detection value.

The present disclosure has been made in view of the foregoing, and it is an object of the present disclosure to provide a vibrating-type gyroscope element capable of reducing a crosstalk voltage included in a voltage generated at a secondary pickoff electrode and an angular velocity sensor including the vibrating-type gyroscope element.

In order to accomplish the above-described object, a vibrating-type gyroscope element according to the present disclosure includes at least a fixed part, a resonator, a plurality of support parts connecting the resonator to the fixed part and vibratably supporting the resonator, and a plurality of electrodes formed in a plane of the resonator, the resonator having a vibration mode of cos Nθ (N is a natural number of two or more), the plurality of electrodes being arranged in such 4N orientations that the axes of the plurality of electrodes are arranged at equiangular intervals in an outer circumferential direction of the resonator, the plurality of electrodes including: at least one primary driving electrode that excites first order vibration of the resonator in the cos Nθ mode, and at least one secondary pickoff electrode that detects second order vibration of the resonator, and a relationship of U≥1 or (S1+S2)−2≥|S1−S2| is satisfied, where S1 is the number of cases where a primary driving electrode is arranged in an orientation adjacent to a clockwise side of a secondary pickoff electrode, S2 is the number of cases where a primary driving electrode is arranged in an orientation adjacent to a counterclockwise side of a secondary pickoff electrode, and U is the number of secondary pickoff electrodes that a primary driving electrode is not arranged in an orientation adjacent to either the clockwise or counterclockwise side thereof.

An angular velocity sensor according to the present disclosure includes at least the vibrating-type gyroscope element, a primary AC power supply that applies an AC power with a predetermined frequency to the primary driving electrode, a secondary detector that detects a voltage signal generated at the secondary pickoff electrode, and a computing unit that calculates an angular velocity based on an output signal from the secondary detector.

According to the vibrating-type gyroscope element of the present disclosure, a crosstalk voltage included in a voltage generated at the secondary pickoff electrode can be reduced. According to the angular velocity sensor of the present embodiment, a crosstalk voltage included in an output signal from the vibrating-type gyroscope element can be reduced, and the accuracy of detection of the angular velocity can be enhanced.

BRIEF DESCRIPTION OF THE FIGURES

FIG. 13 is a table illustrating a relationship among arrangement of primary driving electrodes and secondary pickoff electrodes and conditions for reducing the crosstalk voltage.

DETAILED DESCRIPTION OF VARIOUS EMBODIMENTS

Embodiments of the present disclosure will be described below with reference to the drawings. Note that description of the preferred embodiments below is merely illustrative in nature and is not intended to limit the scope, application, and use of the present disclosure.

First Embodiment

[Configuration of Vibrating-Type Gyroscope Element]

Figure 1:
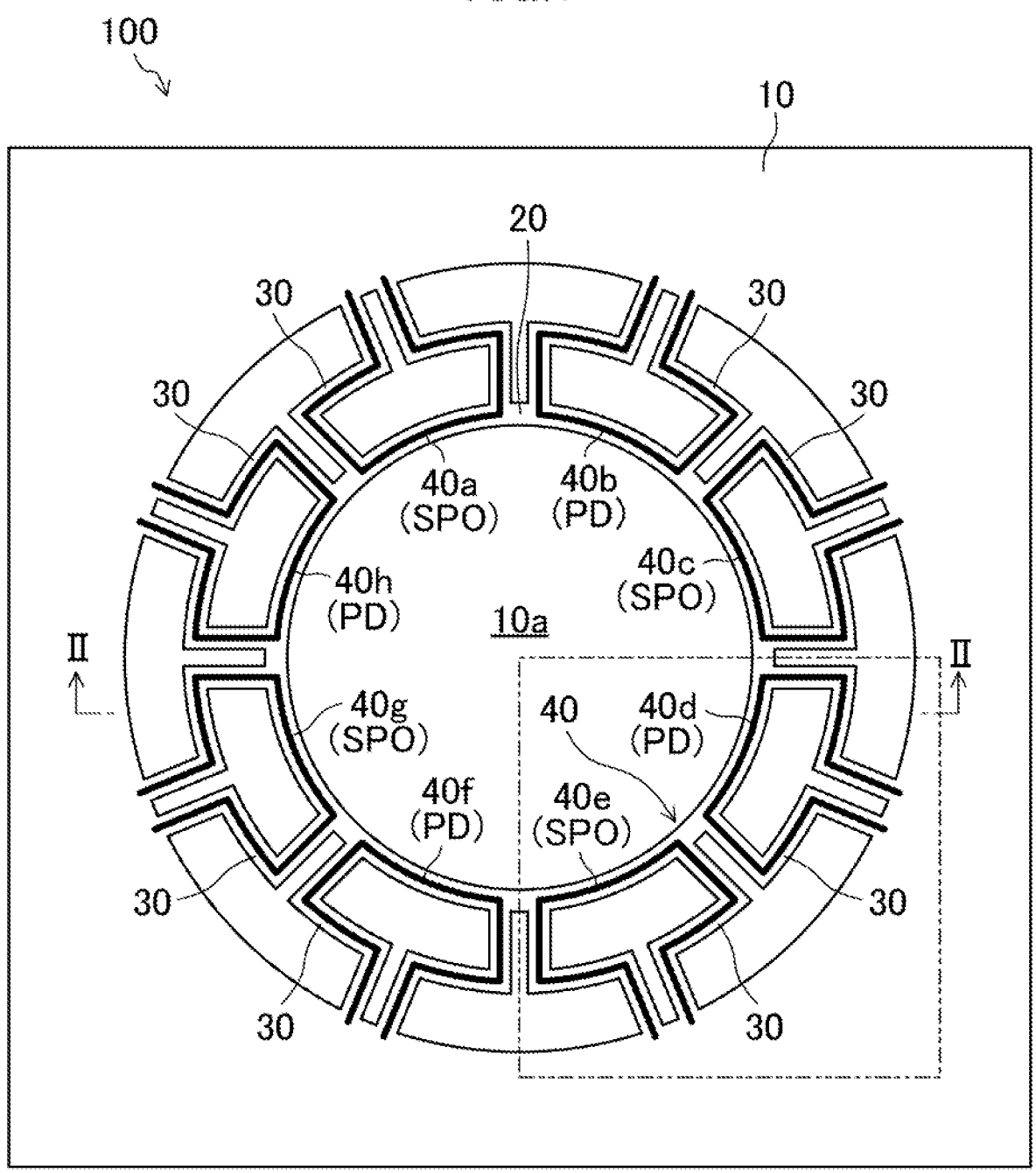
FIG. 1 is a plan view of a vibrating-type gyroscope element according to a first embodiment.
Figure 2:
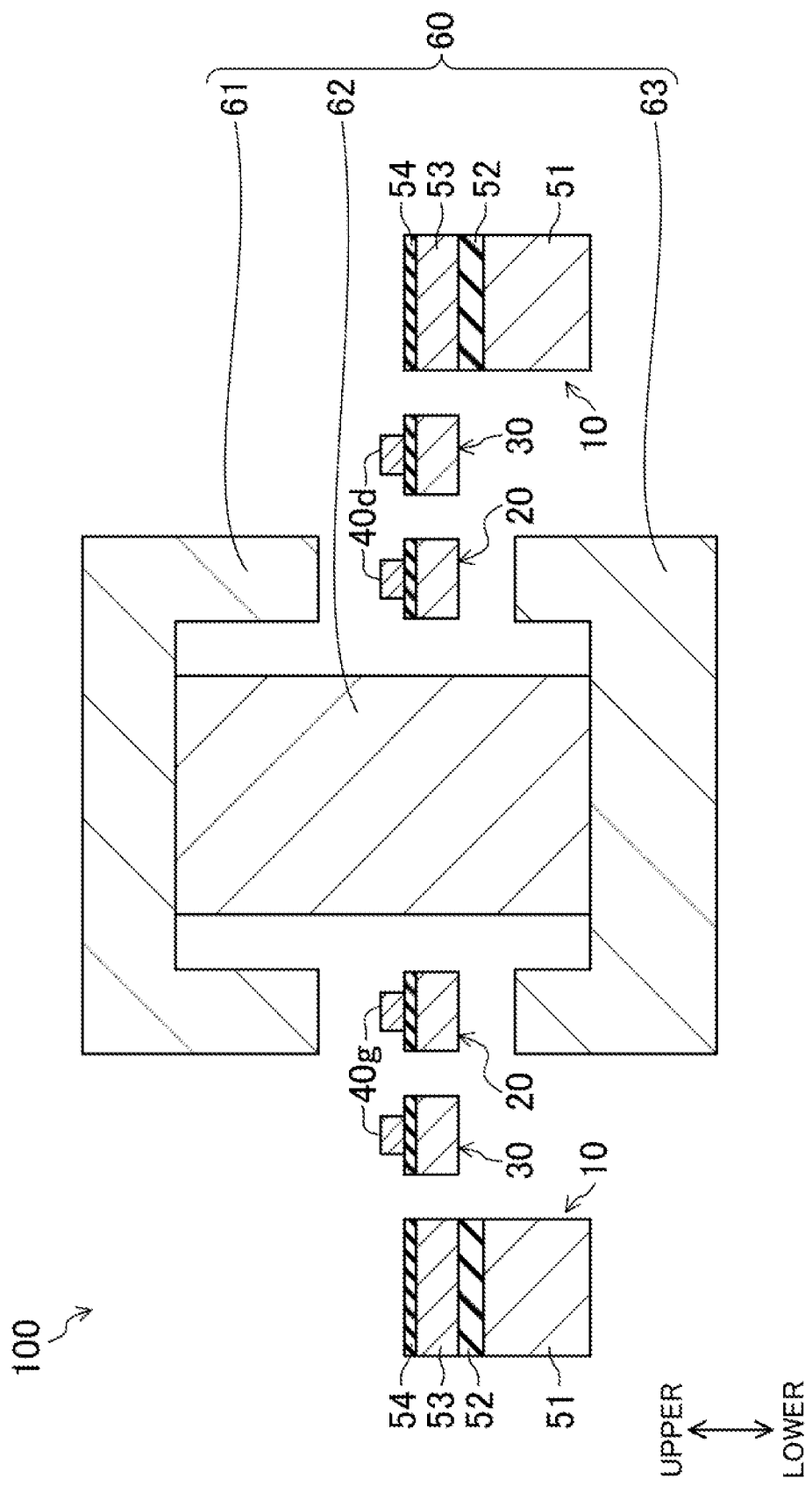
FIG. 2 is a cross-sectional view taken along line II-II in FIG. 1.
Figure 3:
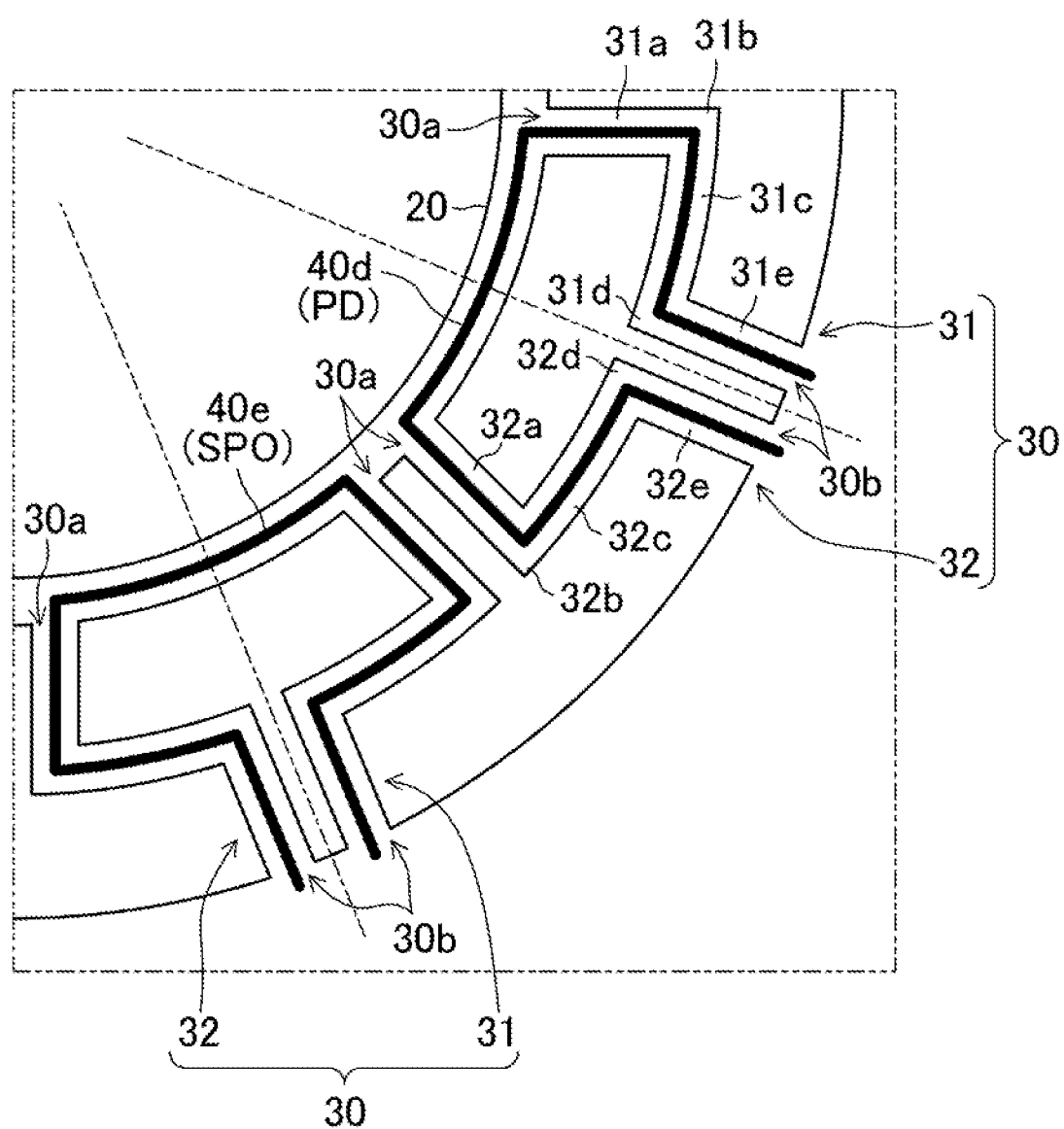
FIG. 3 is an enlarged view of a portion surrounded by a broken line in FIG. 1.

FIG. 1 shows a plan view of a vibrating-type gyroscope element according to a first embodiment, FIG. 2 shows a cross-sectional view taken along line II-II in FIG. 1, and FIG. 3 shows an enlarged view of a portion surrounded by the broken line in FIG. 1.

For the sake of convenience in description, a magnetic field applier 60 is not shown in FIGS. 1 and 3. Also, it should be noted that FIGS. 1 to 3 schematically show the structure of a vibrating-type gyroscope element 100 and do not precisely show an actual dimensional relationship among members.

Note that in description below, a radius direction of a resonator 20 will be sometimes referred to as a radial direction, an outer circumferential direction of the resonator 20 will be sometimes referred to as a circumferential direction, and a direction crossing the radial direction and the circumferential direction will be sometimes referred to as an axial direction. Moreover, in the radial direction, the direction toward the center of the resonator 20 will be sometimes referred to as inner, inward, or inside, and the direction toward the outer circumference of the resonator 20 will be sometimes referred to as outer, outward, or outside. In the axial direction, the direction toward where an upper yoke 61 (see FIG. 2) is provided will be sometimes referred to as upper, upward, or upside, and the direction toward where a lower yoke 63 (see FIG. 2) is provided will be sometimes referred to as lower, downward, or downside. Note that an upper surface of each member described below will be sometimes referred to as a front surface and a lower surface will be sometimes referred to as a back surface.

Moreover, one or more primary driving electrodes will be sometimes collectively referred to as a primary driving electrode PD, and one or more secondary pickoff electrodes will be sometimes collectively referred to as a secondary pickoff electrode SPO.

As shown in FIGS. 1 and 2, the vibrating-type gyroscope element 100 has a fixed part 10, the resonator 20, a plurality of supports 30, a plurality of electrodes 40a to 40h, and the magnetic field applier 60.

As shown in FIG. 1, the fixed part 10 has an opening 10a at the center, and the resonator 20, the plurality of support parts 30, the plurality of electrodes 40a to 40h, and the magnetic field applier 60 are arranged inside the opening 10a. As shown in FIG. 2, the fixed part 10 is a member having a lamination structure in which a first silicon layer 51, a silicon oxide layer (insulating layer) 52, and a second silicon layer 53 are laminated in this order. Further, a silicon oxide film 54 is formed on the front surface of the second silicon layer 53.

The resonator 20 is a circular ring-shaped member obtained by fabricating the second silicon layer 53, and has a vibration mode of cos 2θ.

The support parts 30 are members obtained by fabricating the second silicon layer 53, and are formed integrally with the resonator 20. Moreover, the support parts 30 connect the resonator 20 to the fixed part 10. The support parts 30 support the resonator 20 in a cantilever manner, from another point of view, vibratably support the resonator 20.

As shown in FIG. 3, each of the plurality of support parts 30 has a first leg 31 and a second leg 32. Each of the first leg 31 and the second leg 32 has a first end portion 30a and a second end portion 30b. The first end portions 30a are each connected to different locations of the resonator 20 at first intervals. The second end portions 30b are each connected to different locations of the fixed part 10 at second intervals narrower than the first interval.

The first leg 31 has a first portion 31a extending from the first end portion 30a outward in the radial direction of the resonator 20 and a second portion 31c bent at a first bent portion 31b at one end of the first portion 31a and extending in parallel with the outer circumference of the resonator 20. Further, the first leg 31 has a third portion 31e bent at a second bent portion 31d at one end of the second portion 31c and extending outward to the second end portion 30b in the radial direction of the resonator 20.

Similarly, the second leg 32 has a first portion 32a extending from the first end portion 30a outward in the radial direction of the resonator 20 and a second portion 32c bent at a first bent portion 32b at one end of the first portion 32a and extending in parallel with the outer circumference of the resonator 20. Further, the second leg 32 has a third portion 32e bent at a second bent portion 32d at one end of the second portion 32c and extending outward to the second end portion 30b in the radial direction of the resonator 20.

The second portion 31c of the first leg 31 and the second portion 32c of the second leg 32 extend to the second bent portions 31d, 32d so as to approach each other. The third portion 31e of the first leg 31 and the third portion 32e of the second leg 32 extend in parallel with each other from the second bent portions 31d, 32d to the second end portions 30b with a predetermined space kept therebetween. The first leg 31 and the second leg 32 are arranged symmetrically with respect to a virtual line passing through the center of the resonator 20 and extending between the third portions 31e, 32e.

The electrodes 40a to 40p are conductive members arranged circumferentially in the plane of the resonator 20.

Moreover, each of the electrodes 40a to 40h is formed so as to extend from the support part 30 on the fixed part 10. For example, as shown in FIG. 3, the electrode 40d extends from the second end portion 30b of the first leg 31 to the second end portion 30b of the second leg 32 along the first leg 31, the resonator 20 between the first end portions 30a, and the second leg 32. Moreover, the electrode 40d is formed on the front surface of the silicon oxide film 54. Note that in description below, the electrodes 40a to 40h will be sometimes collectively referred to as an electrode 40 in the case of not particularly focusing on an arrangement orientation in which the electrode is arranged or what function the electrode has. Similarly, electrodes 40a to 40p (see FIG. 14) to be described later may also be referred to as an electrode 40. Note that some or all of the electrodes 40 different in the arrangement orientation but identical in their function are connected with wiring (not shown) provided in the fixed part 10. Note that the "orientation" in the present Description corresponds to a "region" where the electrode 40 is arranged and the orientations are continuous in a case where these regions are adjacent to each other. Moreover, the electrode 40 may be arranged across one orientation. In addition, the size of the electrode 40 may be smaller than the size of one orientation (region). A plurality of electrodes 40 may be arranged in an orientation.

As shown in FIG. 1, four primary driving electrodes PD and four secondary pickoff electrodes SPO are alternately arranged in the circumferential direction. A primary driving electrode PD and another primary driving electrode PD closest thereto are arranged at locations apart from each other by 90 degrees. A secondary pickoff electrode SPO and another secondary pickoff electrode SPO closest thereto are arranged at locations apart from each other by 90 degrees. A primary driving electrode PD and a secondary pickoff electrode SPO adjacent to each other are arranged at locations apart from each other by 45 degrees.

Note that each of the plurality of electrodes 40a to 40h is provided with electrode pads (not shown) at both end portions. Four secondary pickoff electrodes SPO are connected in series through the electrode pads.

As shown in FIG. 2, the magnetic field applier 60 has the upper yoke 61, a magnet 62, and the lower yoke 63. Each of the upper yoke 61 and the lower yoke 63 is a bottomed tubular member made of a magnetic material such as iron. The upper yoke 61 and the lower yoke 63 are arranged such that a tubular portion of the upper yoke 61 and a tubular portion of the lower yoke 63 face each other with a space kept therebetween in the axial direction. The resonator 20 is arranged between the tubular portion of the upper yoke 61 and the tubular portion of the lower yoke 63. The resonator 20 is arranged between the tubular portion of the upper yoke 61 and the tubular portion of the lower yoke 63 with a space kept between the resonator 20 and each tubular portion in the axial direction.

One of upper or lower portions of the magnet 62 is the N-pole, and the other one of the upper or lower portions is the S-pole. The magnet 62 is held by the upper yoke 61, the lower yoke 63, or both thereof, and is arranged in a fixed manner inside the resonator 20.

A magnetic flux flowing from one magnetic pole of the magnet 62 passes through one of the upper yoke 61 or the lower yoke 63, and reaches the resonator 20 and the electrodes 40a to 40h provided in the plane of the resonator 20. Further, the magnetic flux passes through the resonator 20 and the electrodes 40a to 40h, and flows into the other magnetic pole of the magnet 62 through the other one of the upper yoke 61 or the lower yoke 63.

As described above, the magnetic field applier 60 applies a magnetic field to the plurality of electrodes 40a to 40h in a direction crossing the front surface of the resonator 20, which is the axial direction in this case. The magnetic field applier 60 is supported by a support substrate (not shown) so as to keep the positional relationship thereof with the resonator 20 in the radial direction and the axial direction.

The vibrating-type gyroscope element 100 excluding the magnetic field applier 60 is, for example, a micro electro mechanical systems (MEMS) element obtained in such a manner that a well-known silicon on insulator (SOI) substrate is fabricated using a micromachining technique to which a semiconductor micromachining technique is applied.

The MEMS element is manufactured as follows, for example. An SOI substrate having a first silicon layer 51, a silicon oxide layer 52, and a second silicon layer 53 is thermally oxidized, and in this manner, a silicon oxide film 54 is formed on the front surface of the second silicon layer 53.

Next, a plurality of electrodes 40a to 40h is formed on the front surface of the silicon oxide film 54 via a mask pattern (not shown). For example, the plurality of electrodes 40a to 40h is formed in such a manner that a metal film is applied to the front surface of the silicon oxide film 54 via the mask pattern.

The silicon oxide film 54 and the second silicon layer 53 are etched away via another mask pattern (not shown), until the silicon oxide layer 52 is exposed. The basic shapes of support parts 30 and a resonator 20 are formed through these steps.

Next, in a state in which the front surfaces of the electrodes 40a to 40h, the support parts 30, and the resonator 20 are protected with, e.g., wax, the first silicon layer 51 located below the support parts 30 and the resonator 20 is etched away via a mask pattern (not shown) corresponding to an opening 10a of a fixed part 10. Further, the silicon oxide layer 52 is etched away via the same mask pattern, thereby obtaining the above-described MEMS element.

The etching of the first silicon layer 51 and the silicon oxide layer 52 may be dry etching or wet etching. In either case, etchant having a high etch selectivity for a layer as a base layer of an etching layer may be used preferably.

[Configuration and Operation of Angular Velocity Sensor]

Figure 4:
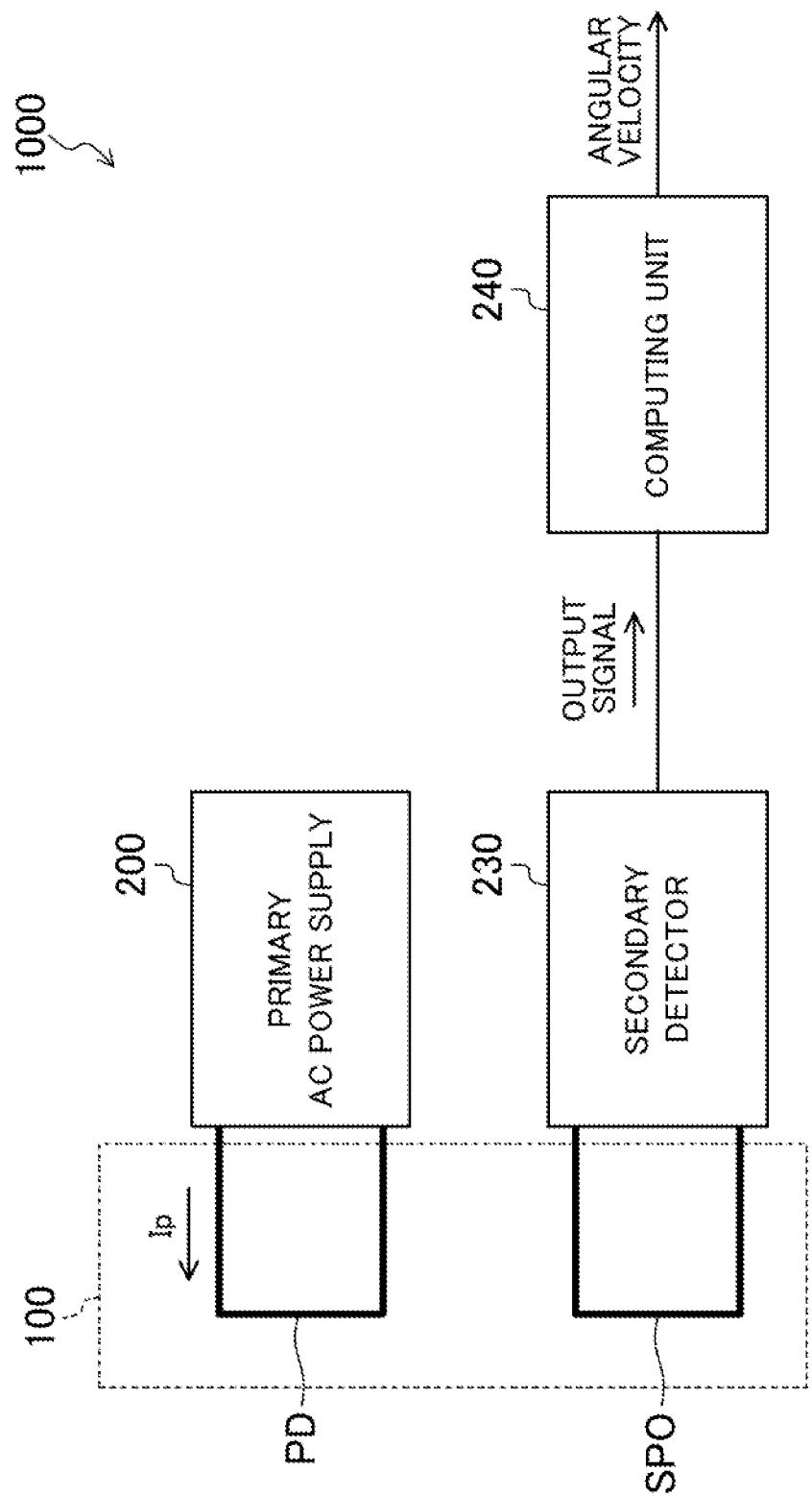
FIG. 4 is a schematic configuration diagram of a circuit block of an angular velocity sensor.

FIG. 4 shows a schematic configuration diagram of a circuit block of an angular velocity sensor. Note that for the sake of convenience in description, only the primary driving electrode PD and the secondary pickoff electrode SPO of the vibrating-type gyroscope element 100 are schematically shown in FIG. 4.

As shown in FIG. 4, an angular velocity sensor 1000 has at least the vibrating-type gyroscope element 100, a primary AC power supply 200, a secondary detector 230, and a computing unit 240.

The primary AC power supply 200 is connected to four primary driving electrodes PD. The secondary detector 230 is connected to four secondary pickoff electrodes SPO connected in series. The computing unit 240 is connected to the secondary detector 230.

Operation of the angular velocity sensor 1000 will be described below.

When an AC current Ip is supplied from the primary AC power supply 200 to the primary driving electrodes PD, Lorentz force is applied to the primary driving electrodes PD in a direction crossing both of the direction of the magnetic field applied from the magnetic field applier 60 and the direction of the flow of the AC current Ip. That is, the Lorentz force acts in a direction parallel with the front surface of the resonator 20. The resonator 20 provided with the primary driving electrodes PD is deformed by the Lorentz force. The direction of the Lorentz force is reversed periodically according to the frequency of the AC current Ip, and therefore, the resonator 20 vibrates with the same frequency. In this case, the resonator 20 vibrates in the direction parallel with the front surface thereof.

By setting the frequency of the AC current Ip according to the resonance frequency of the resonator 20, first order vibration of the resonator 20 in a cos 2θ mode is excited.

It is necessary to apply the AC current Ip to each of four primary driving electrodes PD in such a way that such first order vibration of the resonator 20 is generated. More specifically, the direction of the AC current Ip flowing in the primary driving electrode PD is alternately reversed in four primary driving electrodes PD. More specifically, the primary driving electrodes PD in which the AC current Ip flows in the clockwise direction and the primary driving electrodes PD in which the AC current Ip flows in the counterclockwise direction are alternately arranged as viewed from above. In the example described in the present embodiment, the AC current Ip is set in such a way that two primary driving electrodes PD at the locations apart from each other by 90 degrees in the circumferential direction receive the AC currents Ip flowing in opposite directions, that is, in the clockwise direction and the counterclockwise direction as viewed from above (see FIG. 6). A relationship of connection among four primary driving electrodes PD and the primary AC power supply 200 may only be required to satisfy the above-described setting, and four primary driving electrodes PD may be connected in series with or in parallel with the primary AC power supply 200.

Figure 5A:
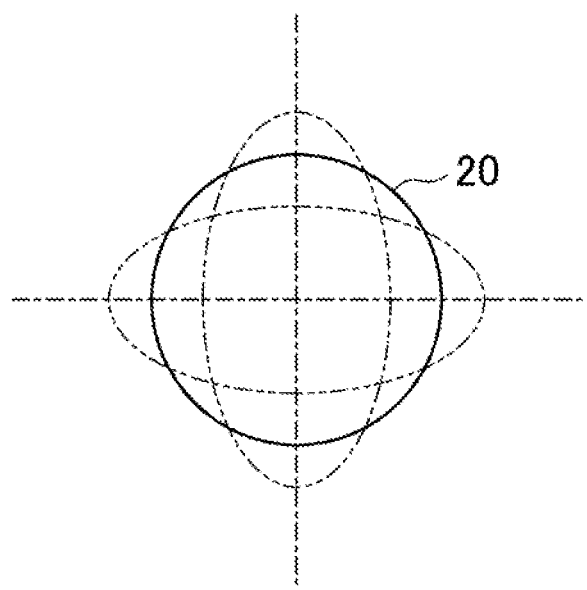
FIG. 5A is a schematic view showing a first order vibration state of a vibrator.
Figure 5B:
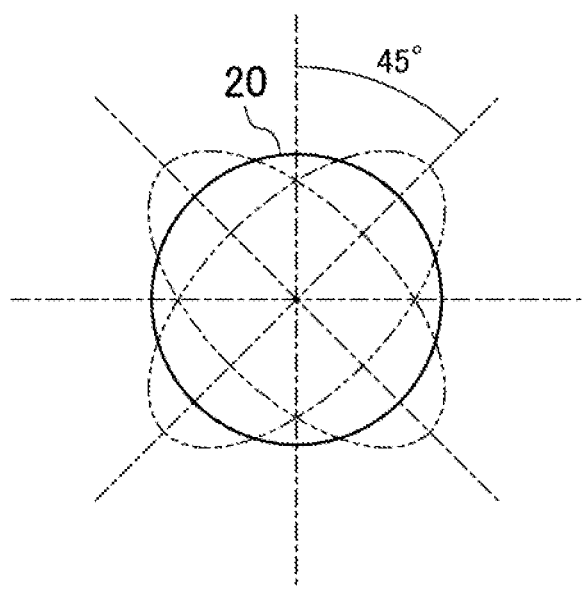
FIG. 5B is a schematic view showing a second order vibration state of a vibrator.

FIG. 5A schematically shows a first order vibration state of the resonator, and FIG. 5B schematically shows a second order vibration state of the resonator.

As shown in FIG. 5A, the first order vibration of the circular ring-shaped resonator 20 is generated to deform the resonator 20 periodically into ellipse shapes having main axes perpendicular to each other. In a case where an angular velocity is generated about the axial direction due to application of Coriolis force to the resonator 20, the directions of the above-described main axes of the ellipse shapes change. In the case of the vibrating-type gyroscope element 100 of the present embodiment shown in FIG. 1, the main axes of the ellipses rotate 45 degrees from where the main axes are in the case of the first order vibration, thereby bringing the resonator 20 into the second order vibration state, as shown in FIG. 5B.

The magnetic field is also applied to the secondary pickoff electrodes SPO in a direction crossing the front surfaces thereof. Meanwhile, in response to the vibration of the resonator 20, the secondary pickoff electrodes SPO also vibrate in a direction parallel with the front surfaces thereof. Accordingly, a voltage is generated at the secondary pickoff electrodes SPO according to the intensity of the magnetic field and the moving velocity at which the secondary pickoff electrodes SPO vibrate. The moving velocity of the secondary pickoff electrodes SPO is different between the case of the resonator 20 in the first order vibration state and the case of the resonator 20 in the second order vibration state, and therefore, the generated voltage is also different between these states.

The secondary detector 230 detects the voltage generated at the secondary pickoff electrode SPO, and outputs to the computing unit 240 a signal corresponding to the level of such a voltage.

As described above, force acts on each electrode 40 during operation of the angular velocity sensor 1000, and a mechanical motion axis is virtually assumed accordingly. In view of the foregoing, the arrangement orientations of the electrodes 40 can also be said to be such orientations that the assumed motion axes (hereinafter sometimes referred to as the axis of the electrode 40) are arranged at equiangular intervals in the outer circumferential direction of the resonator 20.

The computing unit 240 determines, based on the output signal from the secondary detector 230, whether the resonator 20 is in the first order vibration state or the second order vibration state. In a case where it is determined that the resonator 20 is in the second order vibration state, the computing unit 240 calculates the angular velocity based on the output signal from the secondary detector 230.

Note that the vibrating-type gyroscope element 100, the primary AC power supply 200, the secondary detector 230, and the computing unit 240 may be mounted on different substrates or on the same substrate. The vibrating-type gyroscope element 100, the primary AC power supply 200, the secondary detector 230, and the computing unit 240 may be housed in different packages (not shown). The vibrating-type gyroscope element 100 and other components may be mounted on different substrates, or may be housed in different packages. In this case, the primary AC power supply 200 may be mounted on a substrate other than these substrates, or may be housed in a package other than these packages.

As described above, the vibrating-type gyroscope element 100 according to the present embodiment includes at least the fixed part 10, the resonator 20, the support parts 30 connecting the resonator 20 to the fixed part 10 and vibratably supporting the resonator 20, and the electrodes 40a to 40h provided circumferentially in the plane of the resonator 20.

When the resonator 20 has a vibration mode of cos 2θ, the electrodes 40 are arranged at equiangular intervals in the outer circumferential direction of the resonator 20, which are eight orientations arranged at an interval of 45 degrees in this case. Four primary driving electrodes PD and four secondary pickoff electrodes SPO are alternately arranged in eight orientations.

The vibrating-type gyroscope element 100 further includes the magnetic field applier 60 that applies the magnetic field to eight electrodes 40a to 40h in the direction crossing the front surface of the resonator 20, which is the axial direction in this case.

With this configuration of the vibrating-type gyroscope element 100, a crosstalk voltage included in the voltage generated at the secondary pickoff electrode SPO during operation of the vibrating-type gyroscope element 100 can be reduced. This will be further described with reference to the drawings.

Figure 6:
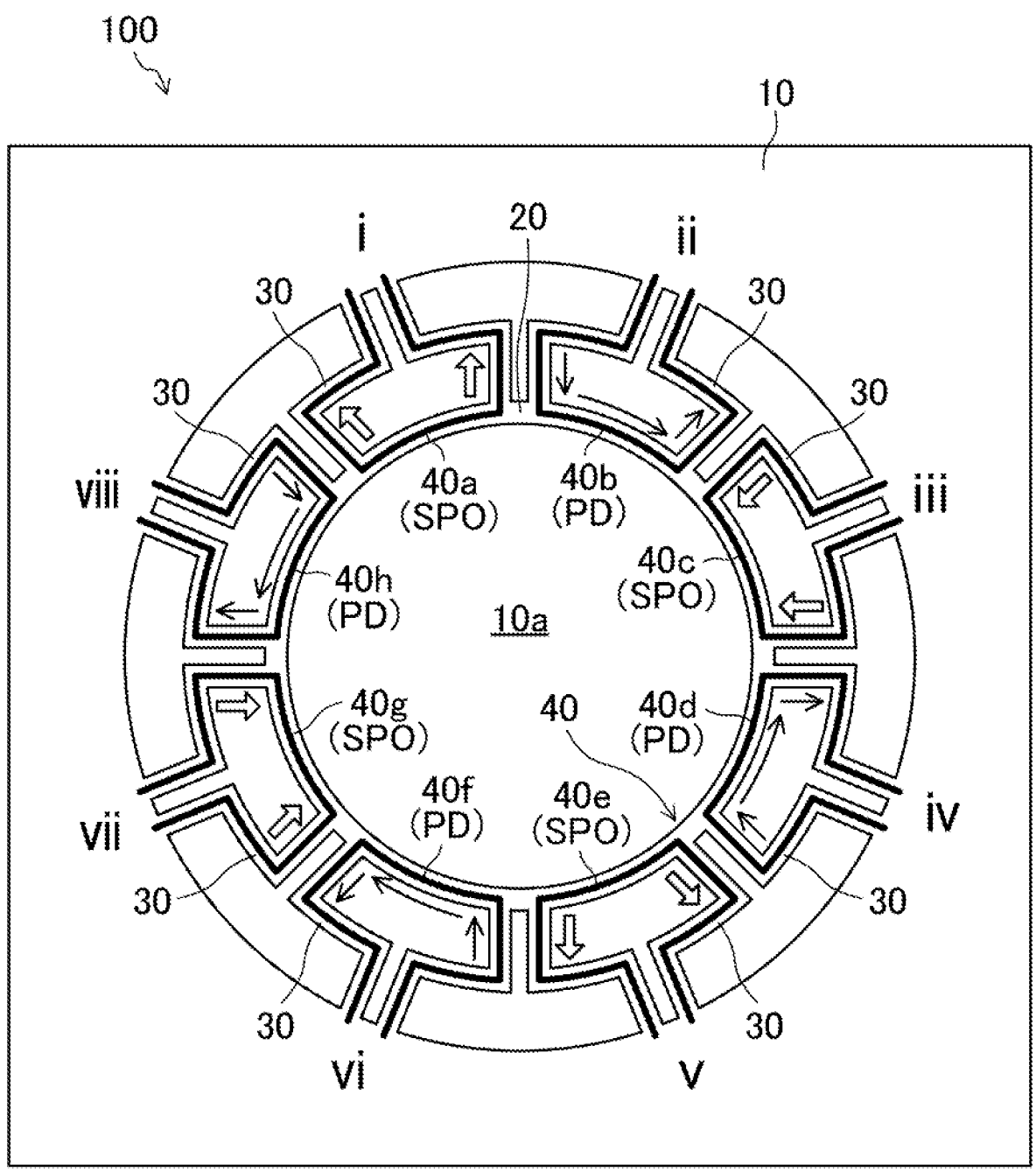
FIG. 6 is a plan view showing a location where a crosstalk voltage is generated during operation of the vibrating-type gyroscope element.
Figure 7:
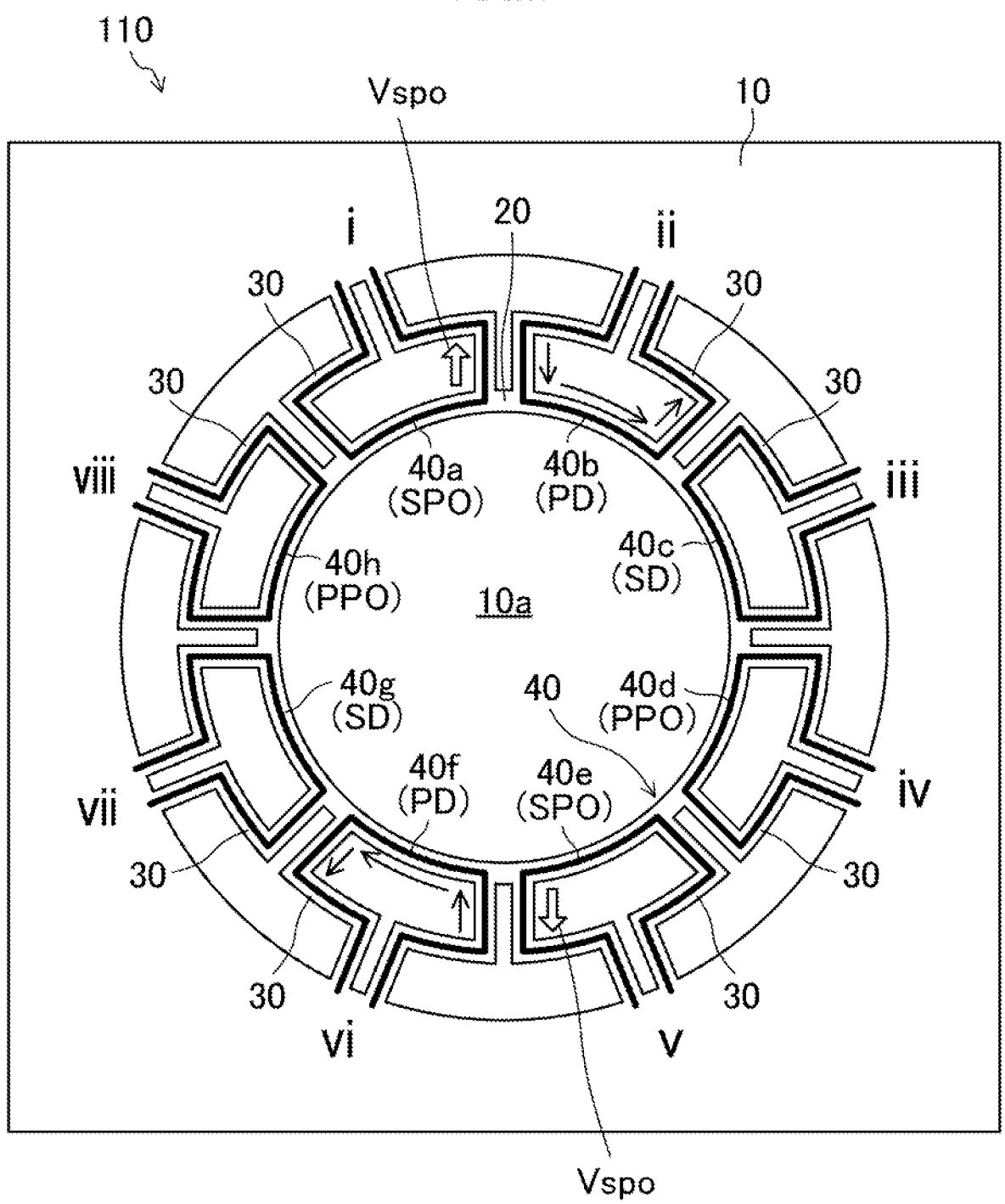
FIG. 7 is a plan view showing a location where a crosstalk voltage is generated during operation of a comparative vibrating-type gyroscope element.

FIG. 6 shows a location where the crosstalk voltage is generated during operation of the vibrating-type gyroscope element of the present embodiment, and FIG. 7 shows a location where a crosstalk voltage is generated during operation of a comparative vibrating-type gyroscope element. Note that in FIGS. 6 and 7, Roman numbers i to viii indicate the order of orientations in which the electrodes 40a to 40h are arranged. The ordering is in the clockwise direction. However, the ordering may be in the counterclockwise direction. Which orientation is the first one of the orientations may be changed as necessary.

In FIG. 6 and the drawings subsequent thereto, the arrow marks shown inside the primary driving electrode PD indicate the direction of the flow of the AC current Ip. The white arrow marks shown inside the secondary pickoff electrode SPO indicate the location where the crosstalk voltage is generated and the direction of electromotive force of the crosstalk voltage.

A vibrating-type gyroscope element 110 shown in FIG. 7 has, for example, a configuration similar to that disclosed in Japanese Patent No. 5410518. The vibrating-type gyroscope element 110 is provided with two types of electrodes in addition to the primary driving electrodes PD and the secondary pickoff electrodes SPO. One type is a primary pickoff electrode PPO, and detects the first order vibration of the resonator 20. The other type is a secondary driving electrode SD, and drives the resonator 20 such that second order vibration generated at the resonator 20 is canceled.

As shown in FIG. 7, primary driving electrodes PD, secondary driving electrodes SD, primary pickoff electrodes PPO, and secondary pickoff electrodes SPO are arranged in eight orientations in this order in the clockwise direction as viewed from above. The electrodes of these types are provided two each, and the electrodes of the same type are arranged at locations apart from each other by 180 degrees in the circumferential direction.

Note that the configurations and operation of a vibrating-type gyroscope element 120 having these four types of electrodes PD, PPD, SD, SPO and an angular velocity sensor 1100 (see FIGS. 14 to 16) will be described later in detail in a second embodiment.

In the vibrating-type gyroscope element 110, the primary driving electrode PD and the secondary pickoff electrode SPO are arranged adjacent to each other. The direction of the AC current Ip flowing in the primary driving electrode PD is the same between two primary driving electrodes PD, and in the example shown in FIG. 7, is the clockwise direction as viewed from above.

In a case where the AC current Ip is applied to the primary driving electrodes PD to generate the first order vibration of the resonator 20, the crosstalk voltage is, due to mutual induction, induced at a portion of the secondary pickoff electrode SPO close to the primary driving electrode PD in distance. As is apparent from FIGS. 1 and 3, adjacent electrodes 40 are distanced from each other in such a way that the first portion 32a of the second leg 32 of one of the electrodes 40 and the first portion 31a of the first leg 31 of the other electrode 40 are the closest to each other in distance.

As is apparent from FIG. 7, the primary driving electrode PD is arranged to be adjacent only to one side of each of two secondary pickoff electrodes SPO, more specifically only to the clockwise side. The crosstalk voltages generated at two secondary pickoff electrodes SPO and having a level of Vspo are the same as each other in electromotive force direction (hereinafter also referred to as a polarity). Thus, in a case where these two secondary pickoff electrodes SPO are connected in series, the crosstalk voltages generated thereat are not canceled out, and a crosstalk voltage at a level of 2Vspo is superimposed on the voltage detected by the secondary detector 230. Such a crosstalk voltage will be, as an error, superimposed on the output signal from the secondary detector 230, and eventually on the angular velocity calculated by the computing unit 240.

Particularly, the amplitude of the AC current Ip is set to a predetermined amplitude or more in order to generate the first order vibration of the resonator 20. This results in a greater crosstalk voltage level of 2Vspo, and for this reason, the error component in the angular velocity due to the crosstalk voltage will become unignorable.

On the other hand, in the vibrating-type gyroscope element 100 of the present embodiment, the primary driving electrodes PD are, as shown in FIG. 6, arranged adjacent to both sides of the secondary pickoff electrode SPO, i.e., both the clockwise and counterclockwise sides. As described above, the direction of the AC current Ip flowing in the primary driving electrode PD is opposite between two primary driving electrodes PD adjacent to the secondary pickoff electrode SPO. In one secondary pickoff electrode SPO, the crosstalk voltage induced in a region adjacent to the primary driving electrode PD on the clockwise side and the crosstalk voltage induced in a region adjacent to the primary driving electrode PD on the counterclockwise side have the opposite polarities. Thus, these crosstalk voltages are canceled out. That is, the level of the crosstalk voltage induced in one secondary pickoff electrode SPO is almost zero. Each of four secondary pickoff electrodes SPO included in the vibrating-type gyroscope element 100 is as such, and therefore, the level of the crosstalk voltage generated at the vibrating-type gyroscope element 100 is substantially zero. As a result, the error component superimposed on the output signal from the secondary detector 230 and therefore on the angular velocity can be greatly reduced.

Four secondary pickoff electrodes SPO may be preferably connected in series.

With this configuration, the voltage signals generated at four secondary pickoff electrodes SPO are added up, and a greater voltage signal can be taken for detecting the second order vibration. Accordingly, a high S/N ratio of the output signal from the secondary detector 230 can be obtained, thereby making it possible to enhance the accuracy of detection of the angular velocity calculated by the computing unit 240.

It is preferable that the support part 30 on which the electrode 40 is arranged includes the first leg 31 having the first to third portions 31a, 31c, 31e and the second leg 32 having the first to third portions 32a, 32c, 32e. It is more preferable that the first leg 31 and the second leg 32 be arranged symmetrically with respect to the virtual line passing through the center of the resonator 20 and extending between the third portions 31e, 32e.

This configuration of the support part 30 makes it possible that, when the first order vibration of the resonator 20 is generated, the resonator 20 can be supported with no great influence on the vibration. The support parts 30 are provided at equiangular intervals in the circumferential direction and the first leg 31 and the second leg 32 are provided symmetrically with respect to the above-described virtual line, and therefore, the resonator 20 can be connected to the fixed part 10 with equal balance. Thus, the first order vibration of the resonator 20 can be stably generated.

The angular velocity sensor 1000 of the present embodiment includes at least the vibrating-type gyroscope element 100, the primary AC power supply 200 that applies the AC current with the predetermined frequency to the primary driving electrodes PD, the secondary detector 230 that detects the voltage signals generated at the secondary pickoff electrodes SPO, and the computing unit 240 that calculates the angular velocity based on the output signal from the secondary detector 230.

According to the angular velocity sensor 1000 of the present embodiment, the crosstalk voltage included in the output signal from the vibrating-type gyroscope element 100 can be reduced, and the accuracy of detection of the angular velocity can be enhanced.

First Modification

Figure 8A:
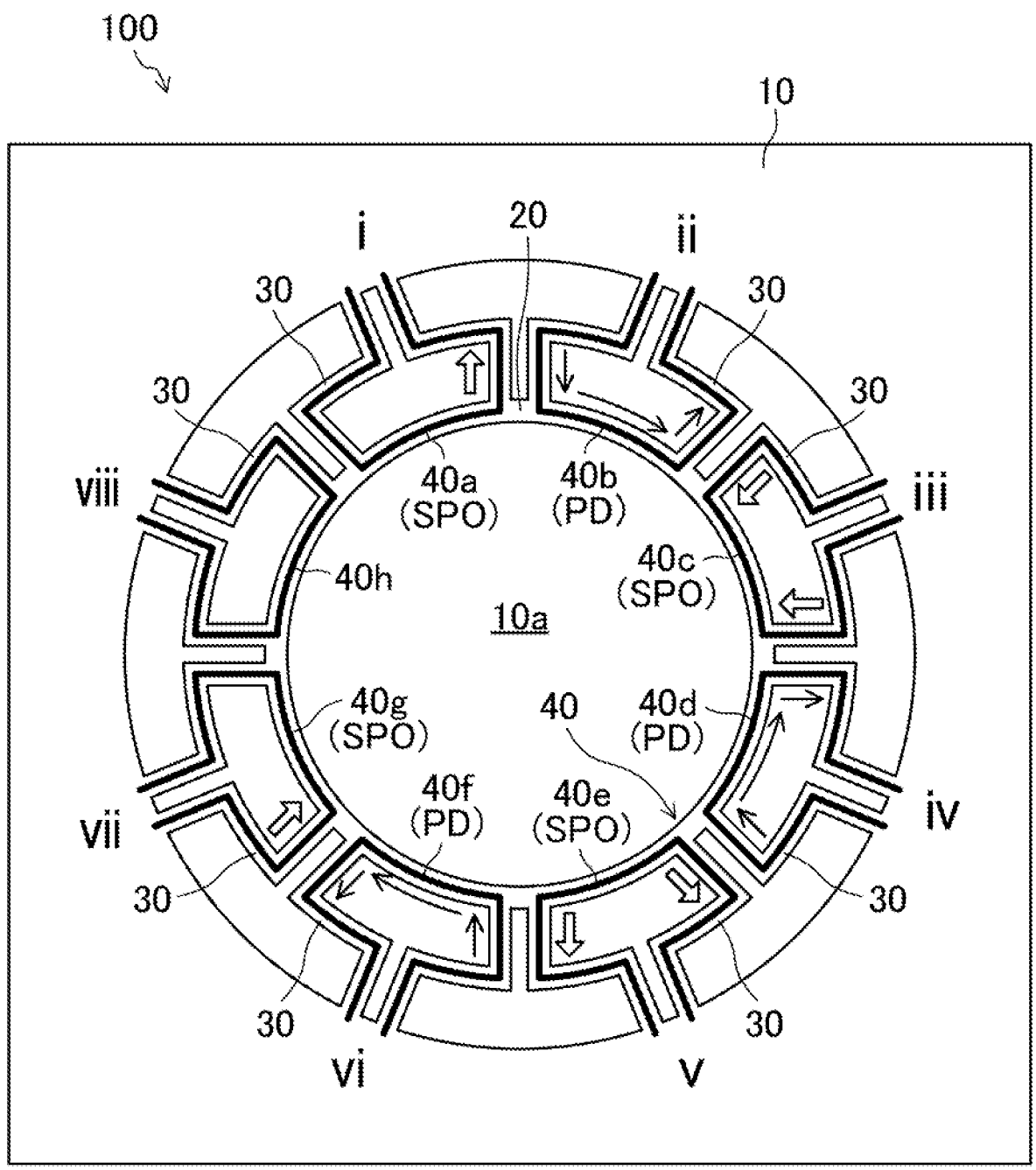
FIG. 8A is a plan view of a vibrating-type gyroscope element according to a first modification.
Figure 8B:
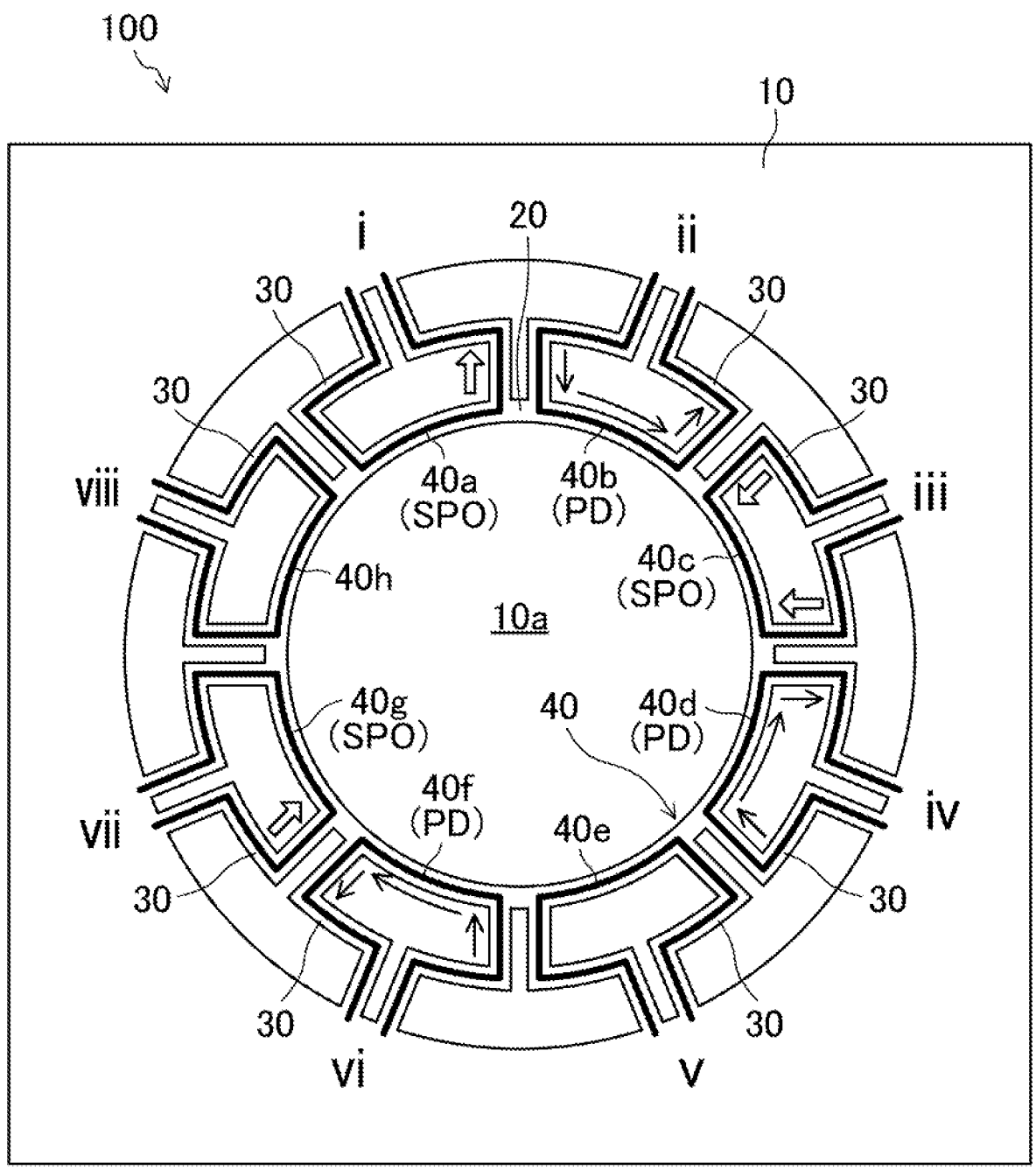
FIG. 8B is a plan view of another vibrating-type gyroscope element according to the first modification.
Figure 8C:
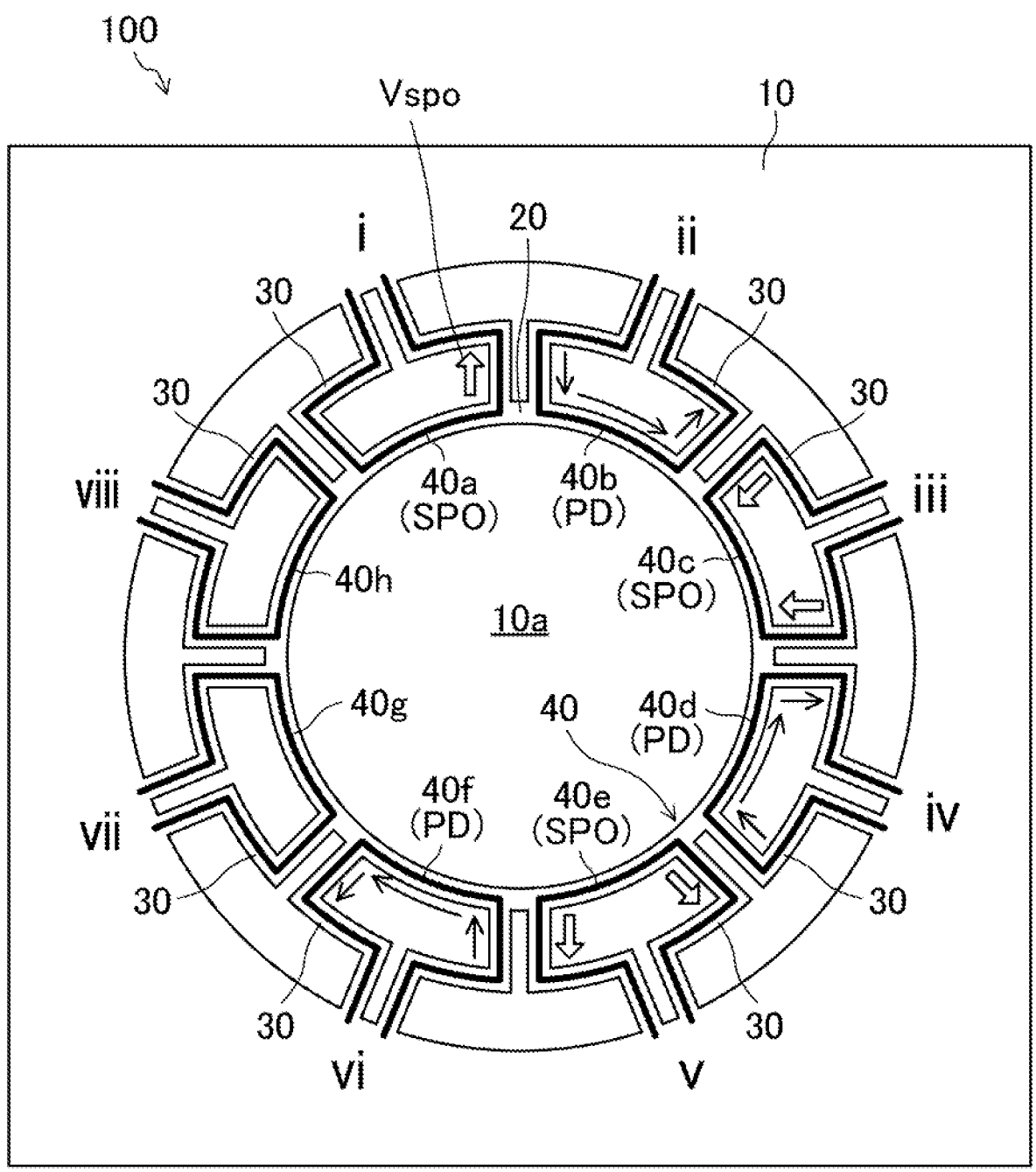
FIG. 8C is a plan view of yet another vibrating-type gyroscope element according to the first modification.

FIG. 8A shows a plan view of a vibrating-type gyroscope element according to the present modification, FIG. 8B shows a plan view of another vibrating-type gyroscope element, and FIG. 8C shows a plan view of yet another vibrating-type gyroscope element. Note that in FIGS. 8A to 8C and each figure subsequent thereto, the like reference numerals are used to represent like elements similar to those of the first embodiment and detailed description thereof will not be repeated.

The configurations shown in FIGS. 8A to 8C are different from the configuration described in the first embodiment in that three primary driving electrodes PD are provided. The direction of the AC current Ip flowing in each of these three primary driving electrodes PD is similar to that shown in FIG. 6.

In the configuration shown in FIG. 8A, three primary driving electrodes PD and four secondary pickoff electrodes SPO are alternately arranged in the circumferential direction. More specifically, the secondary pickoff electrodes SPO are arranged in the first, third, fifth, and seventh orientations, and the primary driving electrodes PD are arranged in the second, fourth, and sixth orientations.

Note that regarding the electrode 40h arranged in the eighth orientation, the type of electrode 40, e.g., whether the electrode 40 is the primary driving electrode PD or the secondary pickoff electrode SPO, is not clearly described. The electrode 40h is a so-called dummy electrode provided for equalizing the balance of the mass of the resonator 20, and does not contribute to detection of the first order vibration and the second order vibration of the resonator 20. Similarly, in each subsequent drawing, the electrodes 40 whose type is not clearly described are dummy electrodes. Note that these dummy electrodes may have another function. For example, these dummy electrodes may be the primary pickoff electrodes PPO or the secondary driving electrodes SD as described above.

In the configuration shown in FIG. 8A, the primary driving electrodes PD are arranged on both sides of each of the secondary pickoff electrodes SPO arranged in the third and fifth orientations. Thus, the crosstalk voltages induced in these two secondary pickoff electrodes SPO are almost zero.

The primary driving electrode PD is arranged adjacent to the clockwise side of the secondary pickoff electrode SPO arranged in the first orientation. The primary driving electrode PD is arranged adjacent to the counterclockwise side of the secondary pickoff electrode SPO arranged in the seventh orientation. As shown in FIG. 8A, the crosstalk voltages induced in these two secondary pickoff electrodes SPO have the same level of Vspo, but on the other hand, have the opposite polarities. Thus, the crosstalk voltages are canceled out to almost zero between the secondary pickoff electrodes SPO arranged in the first and seventh orientations. That is, the voltages generated at four secondary pickoff electrodes SPO connected in series include almost no crosstalk voltage.

In the configuration shown in FIG. 8B, three primary driving electrodes PD and three secondary pickoff electrodes SPO are provided. More specifically, the secondary pickoff electrodes SPO are arranged in the first, third, and seventh orientations, and the primary driving electrodes PD are arranged in the second, fourth, and sixth orientations. The electrodes 40e, 40h arranged in the fifth and eighth orientations are both dummy electrodes.

In this case, the primary driving electrodes PD are arranged on both sides of the secondary pickoff electrode SPO arranged in the third orientation. Thus, the crosstalk voltage induced in such a secondary pickoff electrode SPO is almost zero.

The primary driving electrode PD is arranged adjacent to the clockwise side of the secondary pickoff electrode SPO arranged in the first orientation. The primary driving electrode PD is arranged adjacent to the counterclockwise side of the secondary pickoff electrode SPO arranged in the seventh orientation. As shown in FIG. 8B, the crosstalk voltages induced in these two secondary pickoff electrodes SPO have the same level of Vspo, but on the other hand, have the opposite polarities. Thus, the crosstalk voltages are canceled out to almost zero between the secondary pickoff electrodes SPO arranged in the first and seventh orientations. That is, the voltages generated at three secondary pickoff electrodes SPO connected in series include almost no crosstalk voltage.

In the configuration shown in FIG. 8C, the number of primary driving electrodes PD and the number of secondary pickoff electrodes SPO are the same as those in FIG. 8B. Note that arrangement of these electrodes is different from that in FIG. 8B, the secondary pickoff electrodes SPO are arranged in the first, third, and fifth orientations, and the primary driving electrodes PD are arranged in the second, fourth, and sixth orientations. The electrodes 40g, 40h arranged in the seventh and eighth orientations are both dummy electrodes.

In this case, the primary driving electrodes PD are arranged on both sides of each of the secondary pickoff electrodes SPO arranged in the third and fifth orientations. Thus, the crosstalk voltages induced in these two secondary pickoff electrodes SPO are almost zero.

The primary driving electrode PD is arranged adjacent to the clockwise side of the secondary pickoff electrode SPO arranged in the first orientation. Thus, the crosstalk voltage induced in the secondary pickoff electrode SPO arranged in the first orientation is not zero, and a voltage of Vspo remains. That is, the voltages generated at three secondary pickoff electrodes SPO connected in series include a crosstalk voltage of Vspo.

Second Modification

Figure 9A:
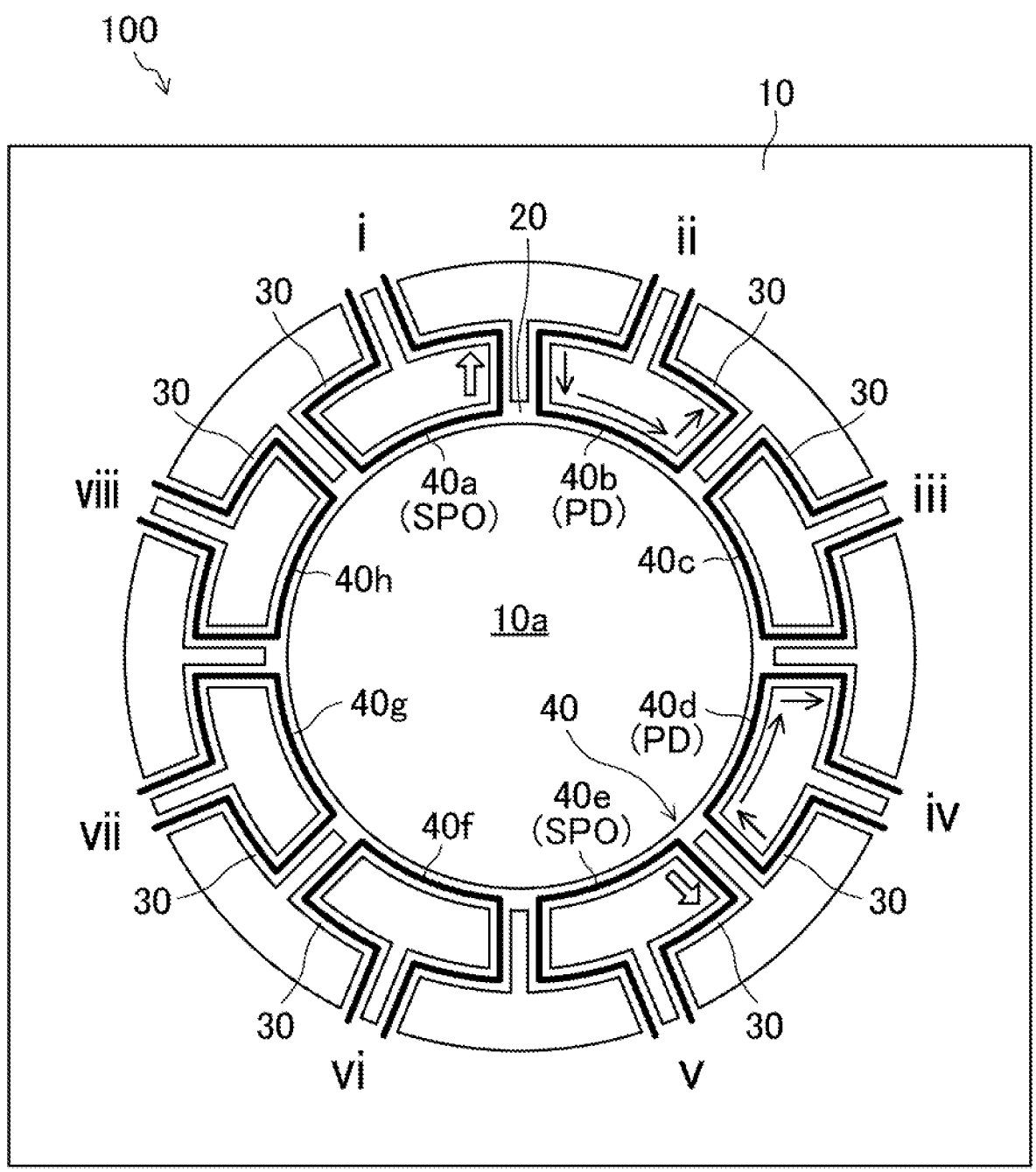
FIG. 9A is a plan view of a vibrating-type gyroscope element according to a second modification.
Figure 9B:
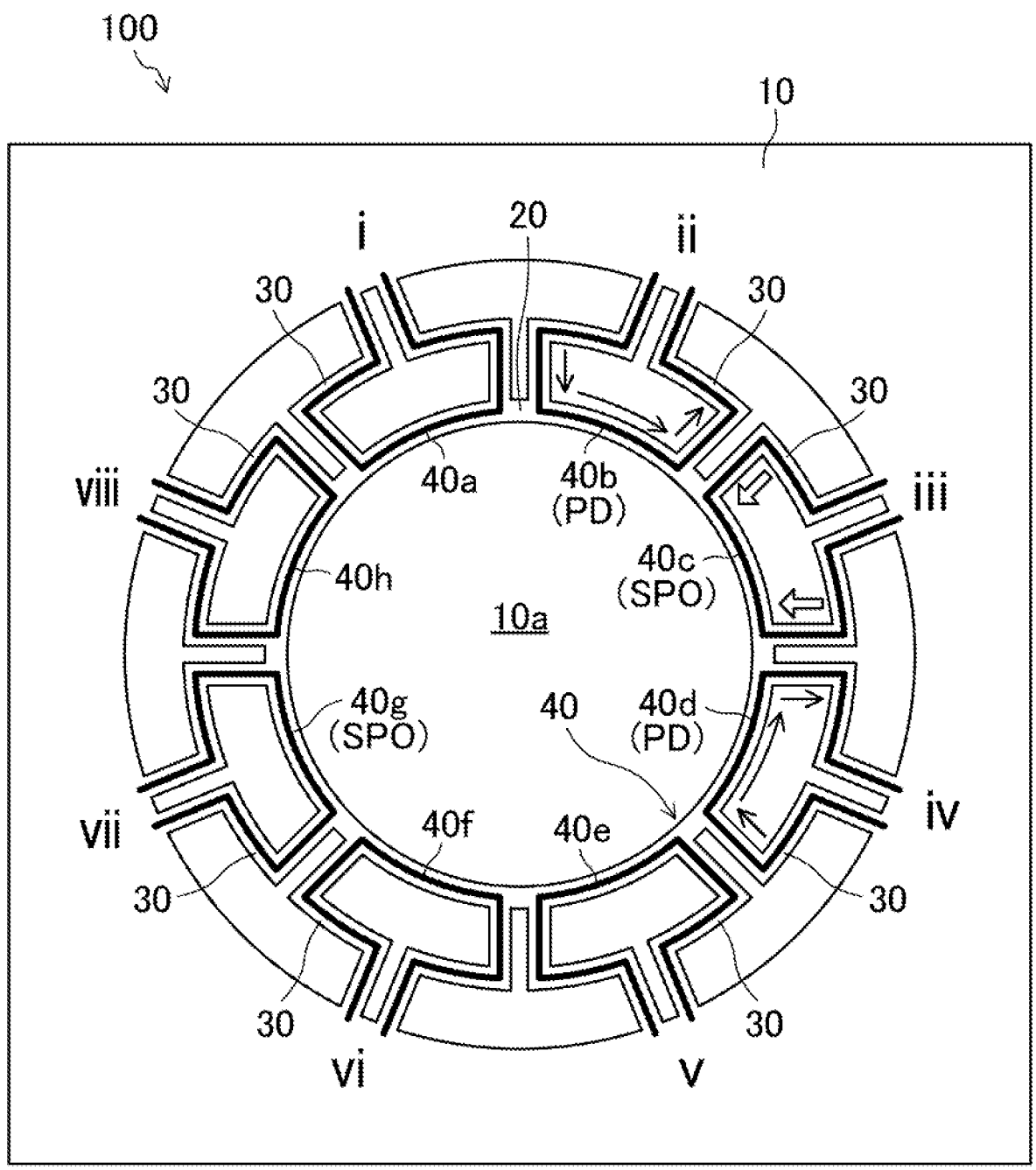
FIG. 9B is a plan view of another vibrating-type gyroscope element according to the second modification.

FIG. 9A shows a plan view of a vibrating-type gyroscope element according to the present modification, and FIG. 9B shows a plan view of another vibrating-type gyroscope element.

The configurations shown in FIGS. 9A and 9B are different from the configuration described in the first embodiment in that two primary driving electrodes PD and two secondary pickoff electrodes SPO are provided. The direction of the AC current Ip flowing in each of two primary driving electrodes PD is similar to that shown in FIG. 6.

In the configuration shown in FIG. 9A, two pairs of electrodes 40, i.e., the primary driving electrode PD and the secondary pickoff electrode SPO, adjacent to each other are arranged in the circumferential direction. More specifically, the secondary pickoff electrodes SPO are arranged in the first and fifth orientations, and the primary driving electrodes PD are arranged in the second and fourth orientations. The electrodes 40c, 40f, 40g, 40h arranged in the third and sixth to eighth orientations are dummy electrodes.

In the configuration shown in FIG. 9A, the primary driving electrode PD is arranged adjacent to the clockwise side of the secondary pickoff electrode SPO arranged in the first orientation. The primary driving electrode PD is arranged adjacent to the counterclockwise side of the secondary pickoff electrode SPO arranged in the fifth orientation. As shown in FIG. 9A, the crosstalk voltages induced in these two secondary pickoff electrodes SPO have the same level of Vspo, but on the other hand, have the opposite polarities. Thus, the crosstalk voltages are canceled out to almost zero between the secondary pickoff electrodes SPO arranged in the first and fifth orientations. That is, the voltages generated at two secondary pickoff electrodes SPO connected in series include almost no crosstalk voltage.

In the configuration shown in FIG. 9B, the secondary pickoff electrodes SPO are arranged in the third and seventh orientations, and the primary driving electrodes PD are arranged in the second and fourth orientations. The electrodes 40a, 40e, 40f, 40h arranged in the first, fifth, sixth, and eighth orientations are dummy electrodes.

In this case, the primary driving electrodes PD are arranged on both sides of the secondary pickoff electrode SPO arranged in the third orientation. Thus, the crosstalk voltage induced in such a secondary pickoff electrode SPO is almost zero.

No primary driving electrodes PD are arranged adjacent to both sides of the secondary pickoff electrode SPO arranged in the seventh orientation. Thus, the crosstalk voltage induced in such a secondary pickoff electrode SPO is also almost zero. That is, the voltages generated at two secondary pickoff electrodes SPO connected in series include almost no crosstalk voltage.

Third Modification

Figure 10A:
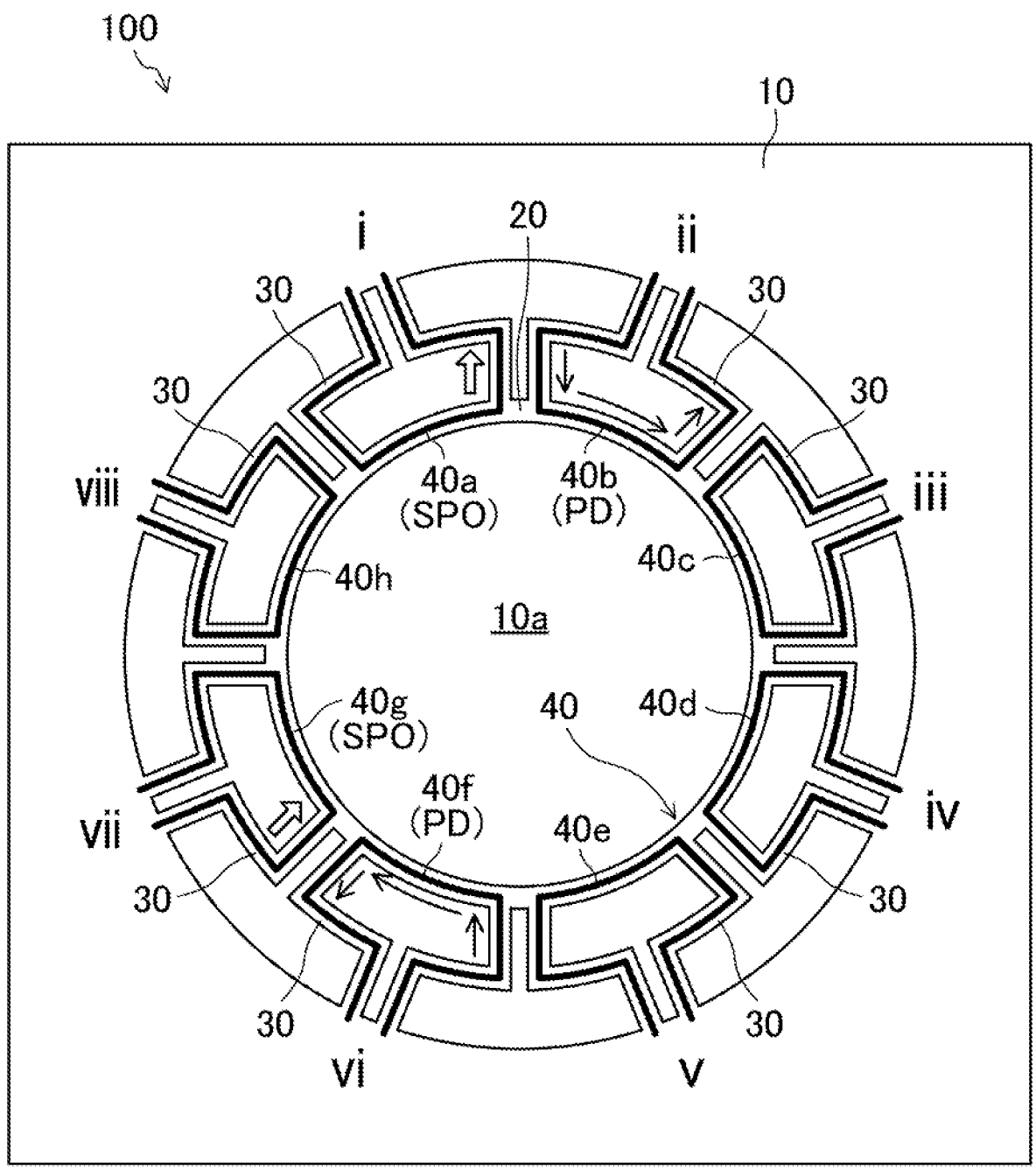
FIG. 10A is a plan view of a vibrating-type gyroscope element according to a third modification.
Figure 10B:
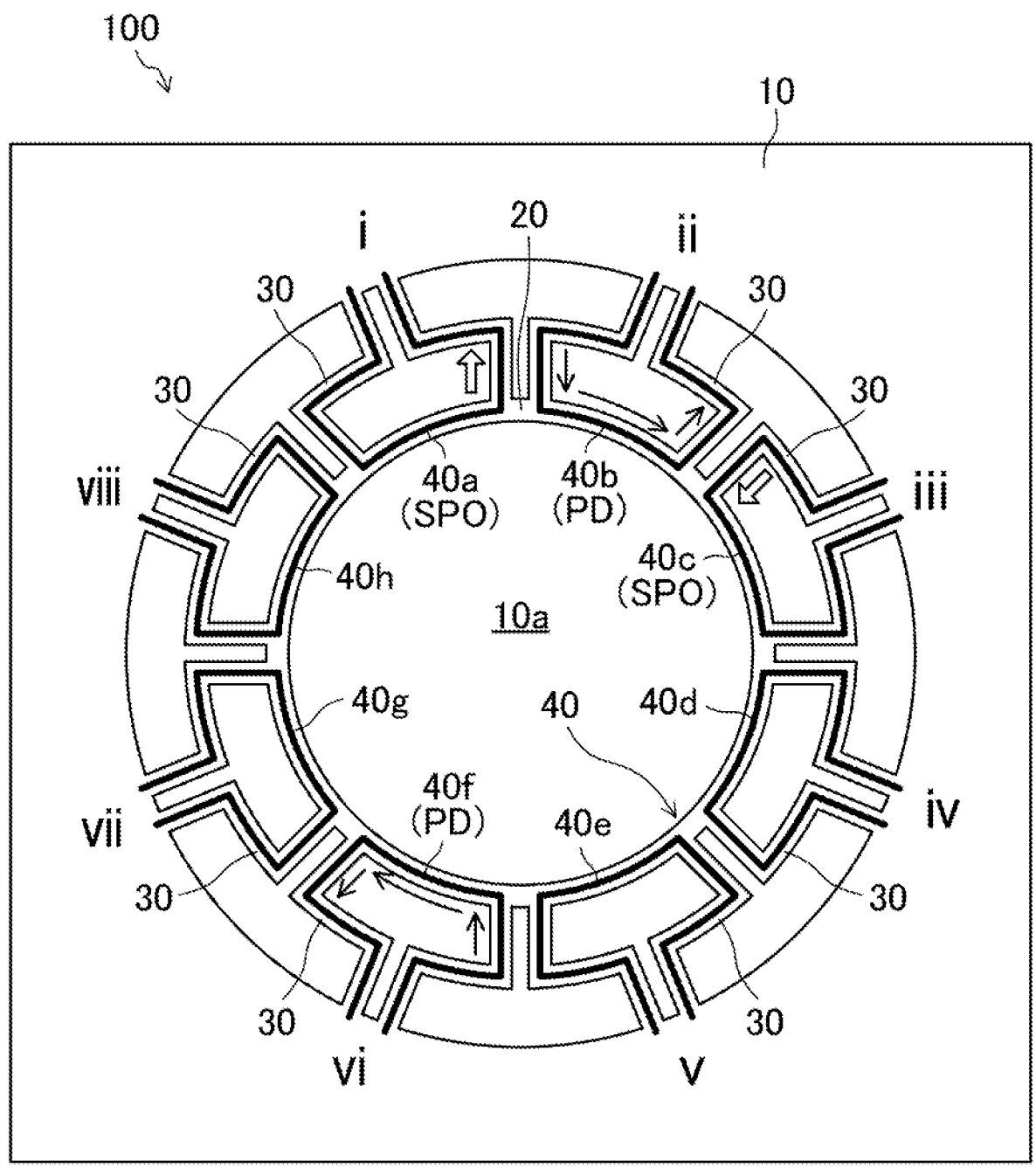
FIG. 10B is a plan view of another vibrating-type gyroscope element according to the third modification.

FIG. 10A shows a plan view of a vibrating-type gyroscope element according to the present modification, and FIG. 10B shows a plan view of another vibrating-type gyroscope element.

In the configurations shown in FIGS. 10A and 10B, two primary driving electrodes PD and two secondary pickoff electrodes SPO are provided as in the configurations described in the second modification. The direction of the AC current Ip flowing in each of two primary driving electrodes PD is similar to that shown in FIG. 6.

In the configuration shown in FIG. 10A, two pairs of electrodes, i.e., the primary driving electrode PD and the secondary pickoff electrode SPO, adjacent to each other are arranged in the circumferential direction. More specifically, the secondary pickoff electrodes SPO are arranged in the first and seventh orientations, and the primary driving electrodes PD are arranged in the second and sixth orientations. The electrodes 40c, 40d, 40e, 40h arranged in the third to fifth and eighth orientations are dummy electrodes.

In the configuration shown in FIG. 10A, the primary driving electrode PD is arranged adjacent to the clockwise side of the secondary pickoff electrode SPO arranged in the first orientation. The primary driving electrode PD is arranged adjacent to the counterclockwise side of the secondary pickoff electrode SPO arranged in the seventh orientation. As shown in FIG. 10A, the crosstalk voltages induced in these two secondary pickoff electrodes SPO have the same level of Vspo, but on the other hand, have the opposite polarities. Thus, the crosstalk voltages are canceled out to almost zero between the secondary pickoff electrodes SPO arranged in the first and seventh orientations. That is, the voltages generated at two secondary pickoff electrodes SPO connected in series include almost no crosstalk voltage.

In the configuration shown in FIG. 10B, the secondary pickoff electrodes SPO are arranged in the first and third orientations, and the primary driving electrodes PD are arranged in the second and sixth orientations. The electrodes 40d, 40e, 40g, 40h arranged in the fourth, fifth, seventh, and eighth orientations are dummy electrodes.

In the configuration shown in FIG. 10B, the primary driving electrode PD is arranged adjacent to the clockwise side of the secondary pickoff electrode SPO arranged in the first orientation. The primary driving electrode PD is arranged adjacent to the counterclockwise side of the secondary pickoff electrode SPO arranged in the third orientation. As shown in FIG. 10B, the crosstalk voltages induced in these two secondary pickoff electrodes SPO have the same level of Vspo, but on the other hand, have the opposite polarities. Thus, the crosstalk voltages are canceled out to almost zero between the secondary pickoff electrodes SPO arranged in the first and third orientations. That is, the voltages generated at two secondary pickoff electrodes SPO connected in series include almost no crosstalk voltage.

Fourth Modification

Figure 11A:
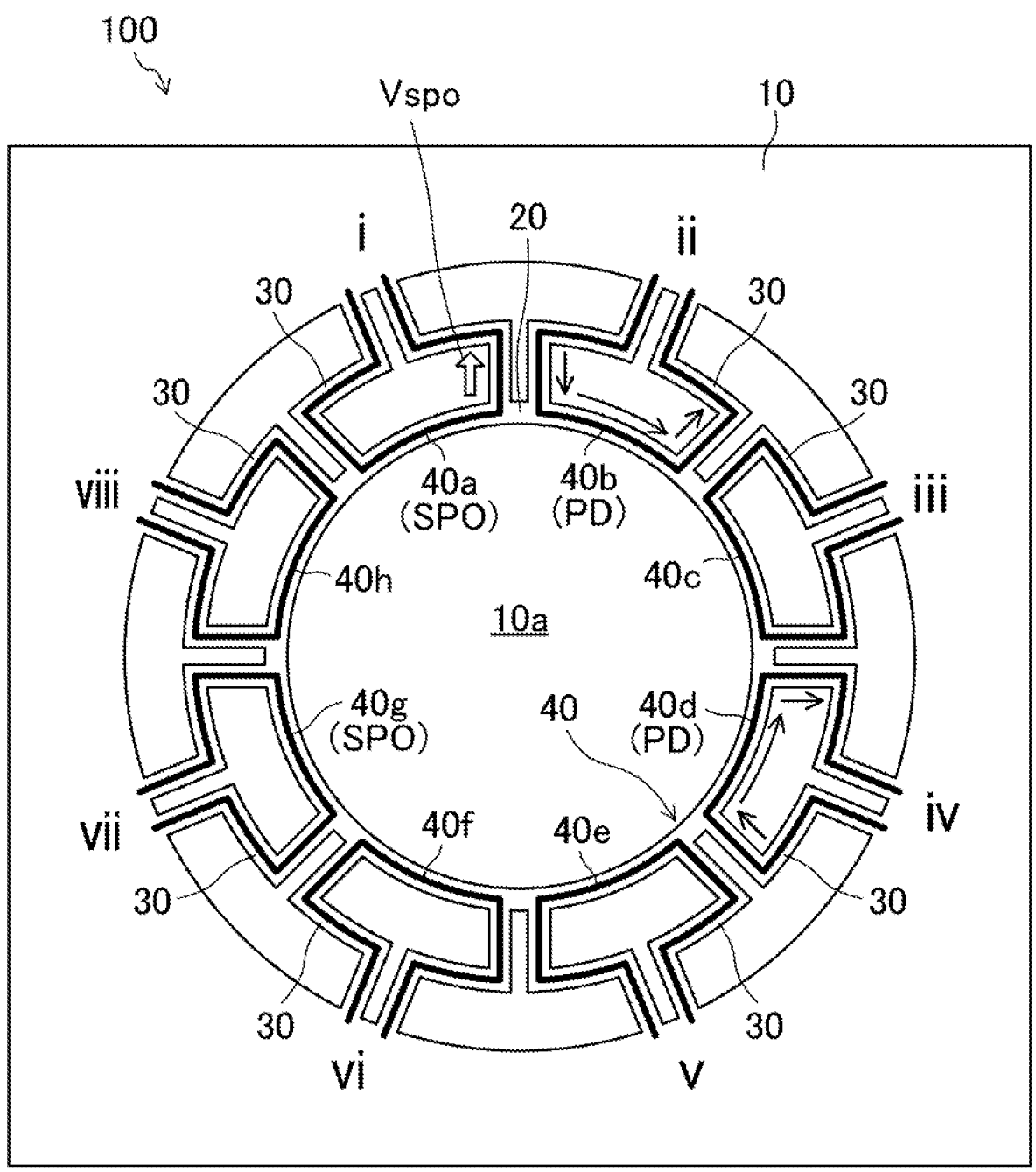
FIG. 11A is a plan view of a vibrating-type gyroscope element according to a fourth modification.
Figure 11B:
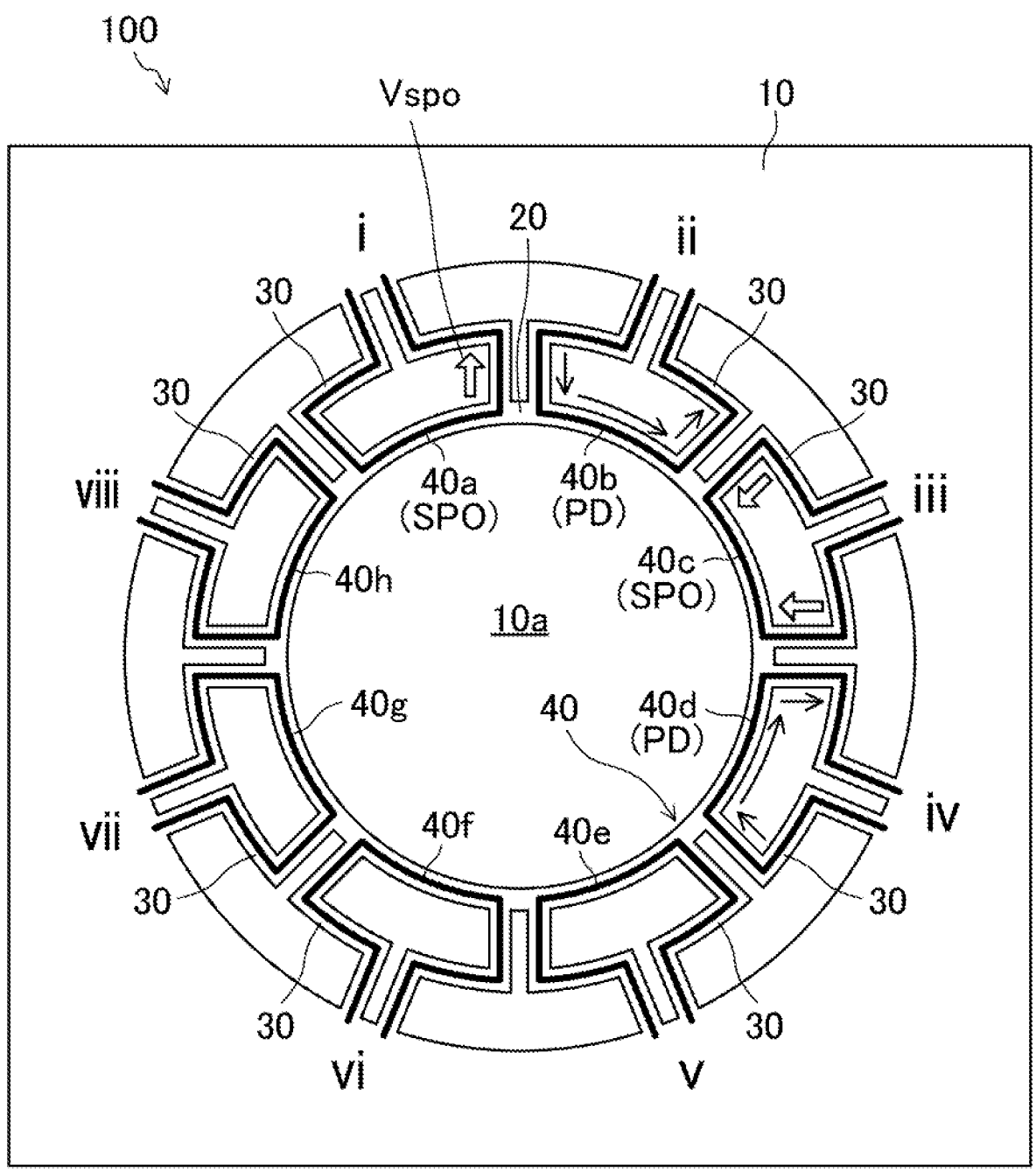
FIG. 11B is a plan view of another vibrating-type gyroscope element according to the fourth modification.

FIG. 11A shows a plan view of a vibrating-type gyroscope element according to the present modification, and FIG. 11B shows a plan view of another vibrating-type gyroscope element.

In the configurations shown in FIGS. 11A and 11B, two primary driving electrodes PD and two secondary pickoff electrodes SPO are provided as in the configurations described in the second modification. The direction of the AC current Ip flowing in each of two primary driving electrodes PD is similar to that shown in FIG. 6.

In the configuration shown in FIG. 11A, the secondary pickoff electrodes SPO are arranged in the first and seventh orientations, and the primary driving electrodes PD are arranged in the second and fourth orientations. The electrodes 40c, 40e, 40f, 40h arranged in the third, fifth, sixth, and eighth orientations are dummy electrodes.

No primary driving electrodes PD are arranged adjacent to both sides of the secondary pickoff electrode SPO arranged in the seventh orientation. Thus, the crosstalk voltage induced in such a secondary pickoff electrode SPO is almost zero.

The primary driving electrode PD is arranged adjacent to the clockwise side of the secondary pickoff electrode SPO arranged in the first orientation. Thus, the crosstalk voltage induced in the secondary pickoff electrode SPO arranged in the first orientation is not zero, and a voltage of Vspo remains. That is, the voltages generated at two secondary pickoff electrodes SPO connected in series include a crosstalk voltage of Vspo.

In the configuration shown in FIG. 11B, the secondary pickoff electrodes SPO are arranged in the first and third orientations, and the primary driving electrodes PD are arranged in the second and fourth orientations. The electrodes 40e, 40f, 40g, 40h arranged in the fifth to eighth orientations are dummy electrodes.

In the configuration shown in FIG. 11B, the primary driving electrodes PD are arranged on both sides of the secondary pickoff electrode SPO arranged in the third orientation. Thus, the crosstalk voltage induced in such a secondary pickoff electrode SPO is almost zero.

The primary driving electrode PD is arranged adjacent to the clockwise side of the secondary pickoff electrode SPO arranged in the first orientation. Thus, the crosstalk voltage induced in the secondary pickoff electrode SPO arranged in the first orientation is not zero, and a voltage of Vspo remains. That is, the voltages generated at two secondary pickoff electrodes SPO connected in series include a crosstalk voltage of Vspo.

Fifth Modification

Figure 12A:
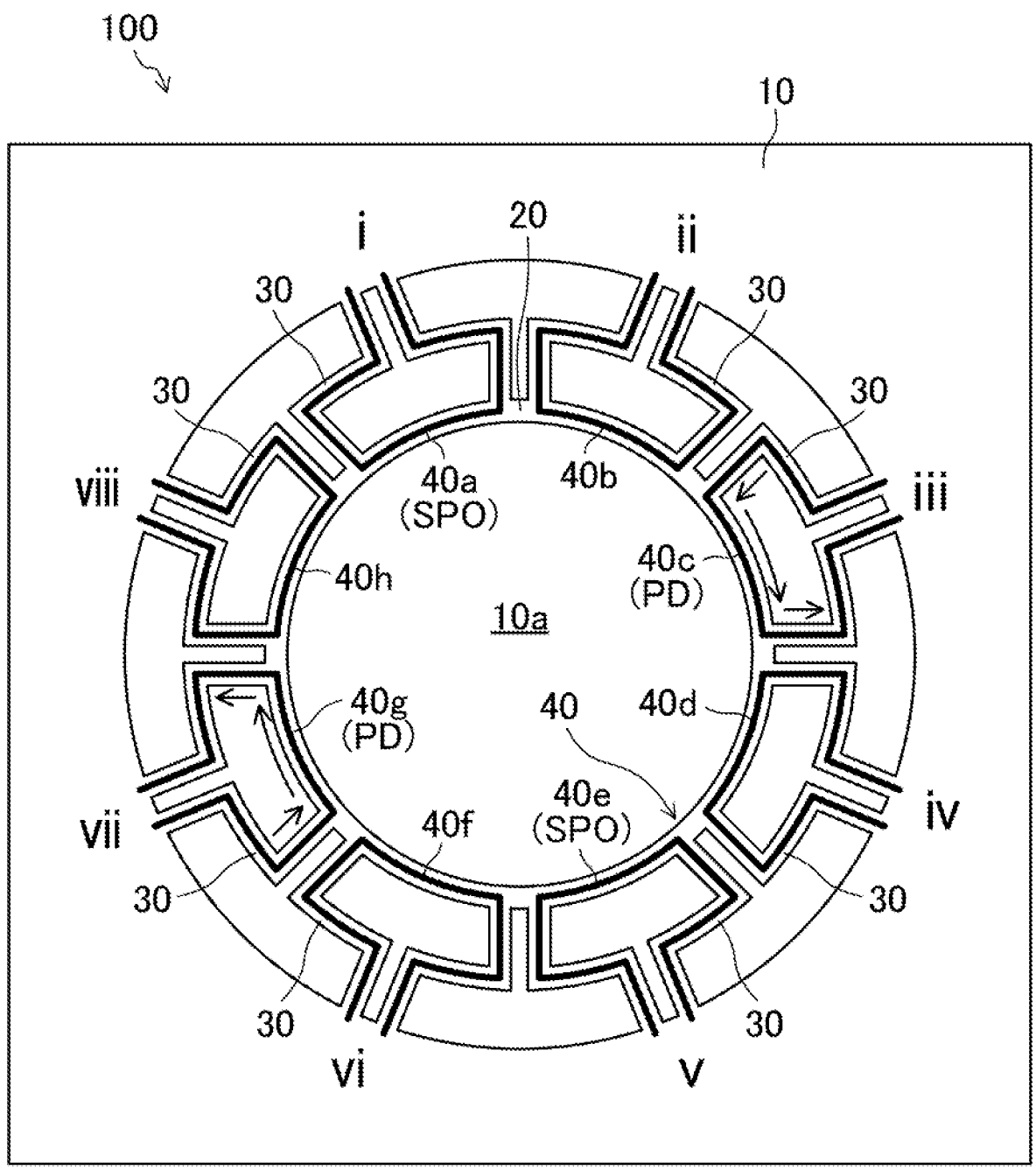
FIG. 12A is a plan view of a vibrating-type gyroscope element according to a fifth modification.
Figure 12B:
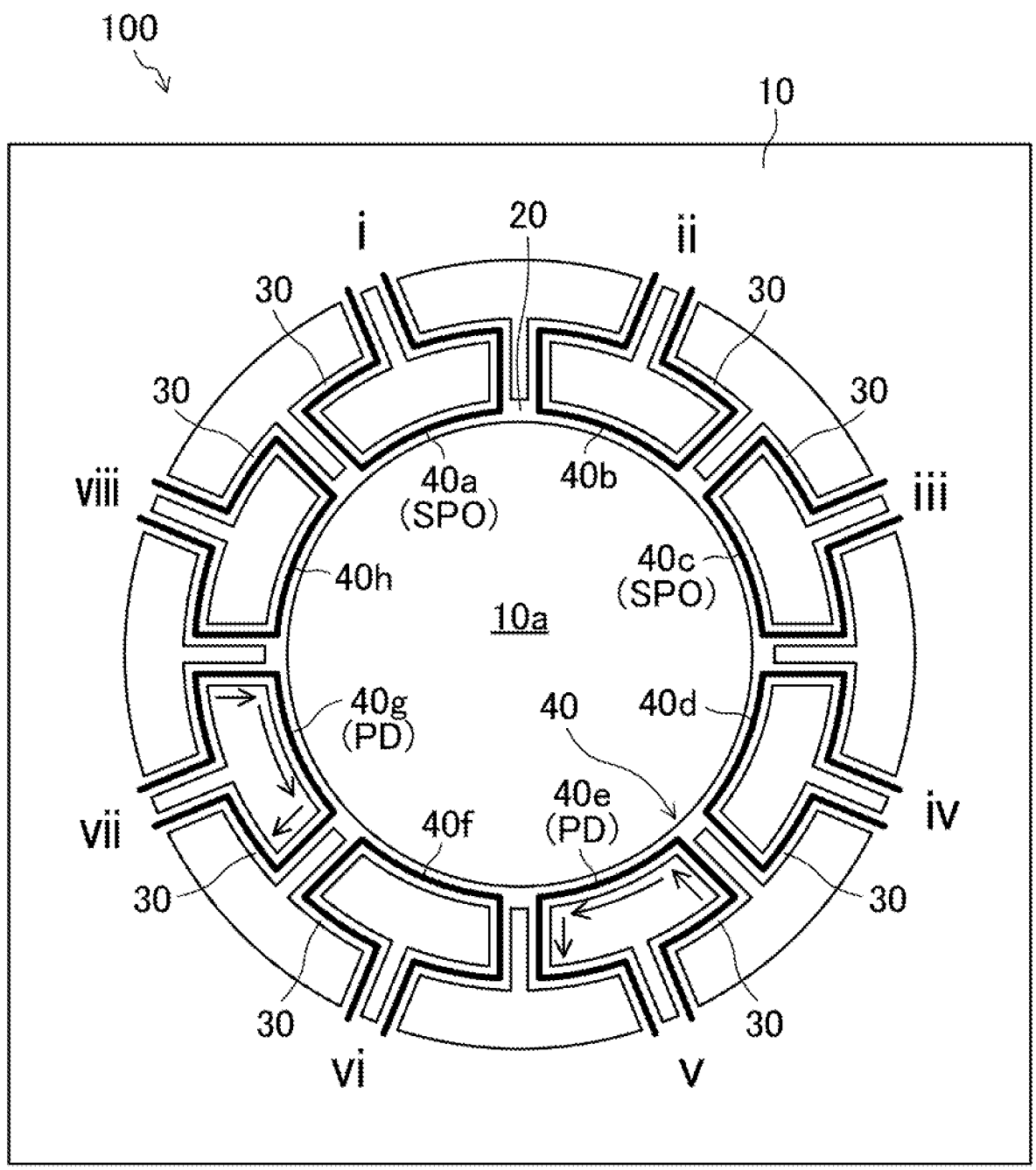
FIG. 12B is a plan view of another vibrating-type gyroscope element according to the fifth modification.

FIG. 12A shows a plan view of a vibrating-type gyroscope element according to the present modification, and FIG. 12B shows a plan view of another vibrating-type gyroscope element.

In the configurations shown in FIGS. 12A and 12B, two primary driving electrodes PD and two secondary pickoff electrodes SPO are provided as in the configurations described in the second modification. The direction of the AC current Ip flowing in each of two primary driving electrodes PD is similar to that shown in FIG. 6.

In the configuration shown in FIG. 12A, the secondary pickoff electrodes SPO are arranged in the first and fifth orientations, and the primary driving electrodes PD are arranged in the third and seventh orientations. The electrodes 40b, 40d, 40f, 40h arranged in the second, fourth, sixth, and eighth orientations are dummy electrodes.

That is, two primary driving electrodes PD are arranged so as to face each other at locations apart from each other by 180 degrees in the circumferential direction. Similarly, two secondary pickoff electrodes SPO are arranged so as to face each other at locations apart from each other by 180 degrees in the circumferential direction. The secondary pickoff electrode SPO is arranged at a location apart from the primary driving electrode PD by 90 degrees in the circumferential direction.

No primary driving electrodes PD are arranged adjacent to both sides of any of the secondary pickoff electrodes SPO arranged in the first and fifth orientations. Thus, the crosstalk voltage induced in such a secondary pickoff electrode SPO is almost zero. That is, the voltages generated at two secondary pickoff electrodes SPO connected in series include almost no crosstalk voltage.

In the configuration shown in FIG. 12B, the secondary pickoff electrodes SPO are arranged in the first and third orientations, and the primary driving electrodes PD are arranged in the fifth and seventh orientations. The electrodes 40b, 40d, 40f, 40h arranged in the second, fourth, sixth, and eighth orientations are dummy electrodes.

That is, two primary driving electrodes PD are arranged at locations apart from each other by 90 degrees in the circumferential direction. Similarly, two secondary pickoff electrodes SPO are arranged at locations apart from each other by 90 degrees in the circumferential direction. The primary driving electrode PD and the secondary pickoff electrode SPO are arranged so as to face each other at locations apart from each other by 180 degrees in the circumferential direction.

No primary driving electrodes PD are arranged adjacent to both sides of any of the secondary pickoff electrodes SPO arranged in the first and third orientations. Thus, the crosstalk voltage induced in such a secondary pickoff electrode SPO is almost zero. That is, the voltages generated at two secondary pickoff electrodes SPO connected in series include almost no crosstalk voltage.

Summary of First Embodiment and First to Fifth Modifications

Note that depending on the arrangement orientation of the primary driving electrode PD and the number of primary driving electrodes PD, the resonator 20 may have a vibration mode of cos Nθ (N is a natural number of two or more). In this case, the arrangement orientations assigned to the electrodes 40 are 4N orientations. Each of the examples described in the first embodiment and the first to fifth modifications is equivalent to a case of N=2.

Classification of the examples described in the first embodiment and the first to fifth modifications, including a case of N≥3, indicates that the arrangement of the primary driving electrodes PD and the secondary pickoff electrodes SPO for reducing the crosstalk voltage satisfies either Expressions (1) or (2) below.

$$U \geq 1 \quad (1)$$

$$(S1 + S2) - 2 \geq |S1 - S2| \quad (2)$$

Here, S1 is the number of cases where the primary driving electrode PD is arranged in the orientation adjacent to the clockwise side of the secondary pickoff electrode SPO. S2 is the number of cases where the primary driving electrode PD is arranged in the orientation adjacent to the counterclockwise side of the secondary pickoff electrode SPO. In description below, these numbers will be sometimes merely referred to as a case number S1 and a case number S2. Moreover, U is the number of secondary pickoff electrodes SPO that the primary driving electrode PD is not arranged in the orientation adjacent to either the clockwise or counterclockwise side of the secondary pickoff electrode SPO.

Note that in the present Description, any of the case numbers S1, S2 is counted as "1" in a case where the primary driving electrodes PD are adjacent to both sides of one secondary pickoff electrode SPO. In this case, since the primary driving electrode PD is adjacent to the clockwise side of the secondary pickoff electrode SPO, the case number S1 is "1." Moreover, since the primary driving electrode PD is also adjacent to the counterclockwise side of the same secondary pickoff electrode SPO, the case number S2 is also "1."

Based on description above, Expressions (1) and (2) will be further described herein.

First, as described in the second, fourth, and fifth modifications, no crosstalk voltage is generated at such a secondary pickoff electrode SPO that the primary driving electrode PD is not arranged in the orientation adjacent to either the clockwise or counterclockwise side of the secondary pickoff electrode SPO. That is, the total crosstalk voltage is reduced if the plurality of secondary pickoff electrodes SPO included in the vibrating-type gyroscope element 100 includes one or more secondary pickoff electrodes SPO satisfying such a condition. That is, if Expression (1) above is satisfied, the crosstalk voltage that will be included in the total of the voltages generated at the secondary pickoff electrodes SPO is reduced.

As described above, the voltages generated at the plurality of secondary pickoff electrodes SPO are added up. Thus, the total of the crosstalk voltage included in the voltages generated at the secondary pickoff electrodes SPO will be the sum of the crosstalk voltage generated at the secondary pickoff electrode SPO in a case where the primary driving electrode PD is arranged in the orientation adjacent to the clockwise side of the secondary pickoff electrode SPO and the crosstalk voltage generated at the secondary pickoff electrode SPO while the primary driving electrode PD is arranged in the orientation adjacent to the counterclockwise side.

Based on description above, it can be said that (S1+S2) corresponds to the maximum value of the crosstalk voltage that will be included in the total of the voltages generated at the secondary pickoff electrodes SPO.

Here, as described above, the polarity of the generated crosstalk voltage is opposite between a case where the primary driving electrode PD is arranged adjacent to the clockwise side of the secondary pickoff electrode SPO and a case where the primary driving electrode PD is arranged adjacent to the counterclockwise side.

Thus, ((S1+S2)-2) in Expression (2) means a case where cancellation of the crosstalk voltage occurs once, i.e., a case where there is a pair of secondary pickoff electrodes SPO where the crosstalk voltages are canceled out. In other words, ((S1+S2)-2) in Expression (2) corresponds to the level of the crosstalk voltage that will be included in the total of the voltages generated at the secondary pickoff electrodes SPO in a case where the crosstalk voltage is reduced by a single cancellation.

On the other hand, |S1-S2| in Expression (2) corresponds to the level of a net crosstalk voltage that will be included in the total of the voltages generated at the secondary pickoff electrodes SPO after actual cancellation.

Based on description above, Expression (2) means that the plurality of secondary pickoff electrodes SPO includes one or more secondary pickoff electrodes SPO where cancellation of the crosstalk voltage occurs. That is, if Expression (2) above is satisfied, the crosstalk voltage included in the total of the voltages generated at the secondary pickoff electrodes SPO is reduced.

FIG. 13 shows a relationship among arrangement of the primary driving electrodes and the secondary pickoff electrodes and conditions for reducing the crosstalk voltage.

As is apparent from FIG. 13, the relationship indicated by Expression (2) is satisfied in most of the examples described in the first embodiment and the first to fifth modifications. That is, each of the case numbers S1, S2 is one or more, and the crosstalk voltage is reduced by cancellation.

On the other hand, in the examples shown in FIG. 11A of the fourth modification and FIGS. 12A and 12B of the fifth modification, the relationship indicated by Expression (2) is not satisfied, but the relationship indicated by Expression (1) is satisfied. Even in these cases, it is apparent from FIG. 13 that the crosstalk voltage is reduced as compared to the comparative example shown in FIG. 7.

Note that as is apparent from description of Expression (2), if the case number S1 and the case number S2 are the same value, i.e., S1=S2, the net crosstalk voltage included in the total of the voltages generated at the secondary pickoff electrodes SPO is zero, so that the crosstalk voltage is most reduced.

As is apparent from FIG. 13, the examples shown in FIGS. 6, 8A, 8B, 9A, 9B, 10A, and 10B satisfy this condition (S1=S2). If S1=S2=0 is also included, the examples shown in FIGS. 12A and 12B also satisfy this condition.

As the summary of the vibrating-type gyroscope elements 100 described in the first embodiment and the first to fifth modifications, the following points apply to arrangement of the primary driving electrodes PD and the secondary pickoff electrodes SPO.

Condition A

In continuous orientations from the first to the K-th (K is an odd number and 3≤K≤4N-1) orientations, the electrode 40 arranged in each of the first and K-th orientations is either the primary driving electrode PD or the secondary pickoff electrode SPO. At the electrodes 40 in the first to K-th orientations, at least one or more regions where the primary driving electrodes PD and the secondary pickoff electrodes SPO are alternately arranged adjacent to each other are provided as viewed in any of the clockwise and the counterclockwise directions.

A condition A means that there are one or more secondary pickoff electrodes SPO where the crosstalk voltage is canceled. Thus, it is apparent that if such a condition is satisfied, the relationship indicated by Expression (2) above is satisfied.

Note that the examples shown in FIGS. 6, 8A to 8C, 9A, 10A, 10B, and 11B satisfy the condition A. Note that the configuration shown in FIG. 9B also satisfies the condition A, assuming that the first orientation is the orientation of the primary driving electrode PD adjacent counterclockwise to the secondary pickoff electrode SPO, which is originally located in the first orientation as shown in FIG. 6.

Arrangement of the primary driving electrodes PD and the secondary pickoff electrodes SPO satisfying the condition A is further classified as follows. Note that there may be arrangement of the primary driving electrodes PD and the secondary pickoff electrodes SPO satisfying both conditions A1, A2.

Condition A1

There are two or more pairs, which satisfy the following condition, of the primary driving electrode PD and the secondary pickoff electrode SPO that the primary driving electrode PD is adjacent only to one side of such a secondary pickoff electrode SPO. First, in such a pair of electrodes, the primary driving electrode PD and the secondary pickoff electrode SPO are adjacent to each other. Moreover, in this case, the secondary pickoff electrodes SPO each included in the pairs are arranged in the orientations apart from each other by $(360/2N+360\times(M/2N))$ degrees, and the primary driving electrodes PD are arranged in the orientations apart from each other by $(360/N+360\times(M/2N))$ or $(360\times(M/2N))$ degrees (see FIGS. 8A, 8B, and 10A). Note that the secondary pickoff electrodes SPO are arranged in the orientations apart from each other within an angular range of more than 0 degrees and less than 360 degrees. Similarly, the primary driving electrodes PD are arranged in the orientations apart from each other within an angular range of more than 0 degrees and less than 360 degrees. Here, M is an integer of 0 or more.

Condition A2

There are two or more pairs, which satisfy the following condition, of the primary driving electrode PD and the secondary pickoff electrode SPO that the primary driving electrode PD is adjacent only to one side of such a secondary pickoff electrode SPO. First, in such a pair of electrodes, the primary driving electrode PD and the secondary pickoff electrode SPO are adjacent to each other. Moreover, in this case, the primary driving electrodes PD each included in the pairs are arranged in the orientations apart from each other by $(360/2N+360\times(M/2N))$ degrees, and the secondary pickoff electrodes SPO are arranged in the orientations apart from each other by $(360/N+360\times(M/2N))$ or $(360\times(M/2N))$ degrees (see FIG. 9A). Note that the primary driving electrodes PD are arranged in the orientations apart from each other within an angular range of more than 0 degrees and less than 360 degrees. More similarly, the secondary pickoff electrodes SPO are arranged in the orientations apart from each other within an angular range of more than 0 degrees and less than 360 degrees.

Condition A3

The primary driving electrode PD is arranged in the orientation adjacent to any of the clockwise and counter-clockwise sides of at least one secondary pickoff electrode SPO (see FIGS. 6, 8A to 8C, 9B, and 11B). Note that the example shown in FIG. 6 is a case of N=2, where 2N primary driving electrodes PD and 2N secondary pickoff electrodes SPO are alternately arranged in 4N orientations.

Second Embodiment

Figure 14:
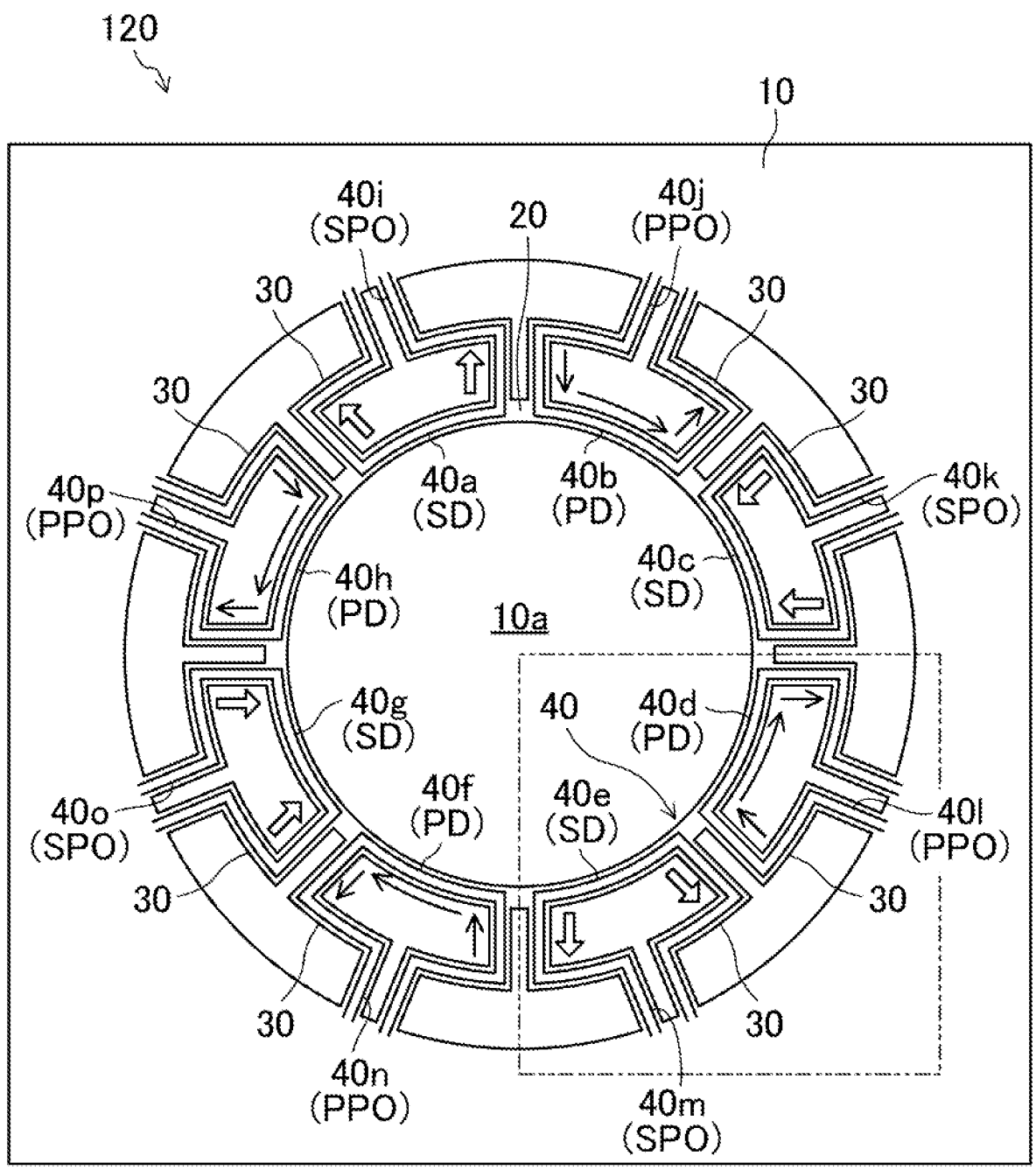
FIG. 14 is a plan view of a vibrating-type gyroscope element according to a second embodiment.
Figure 15:
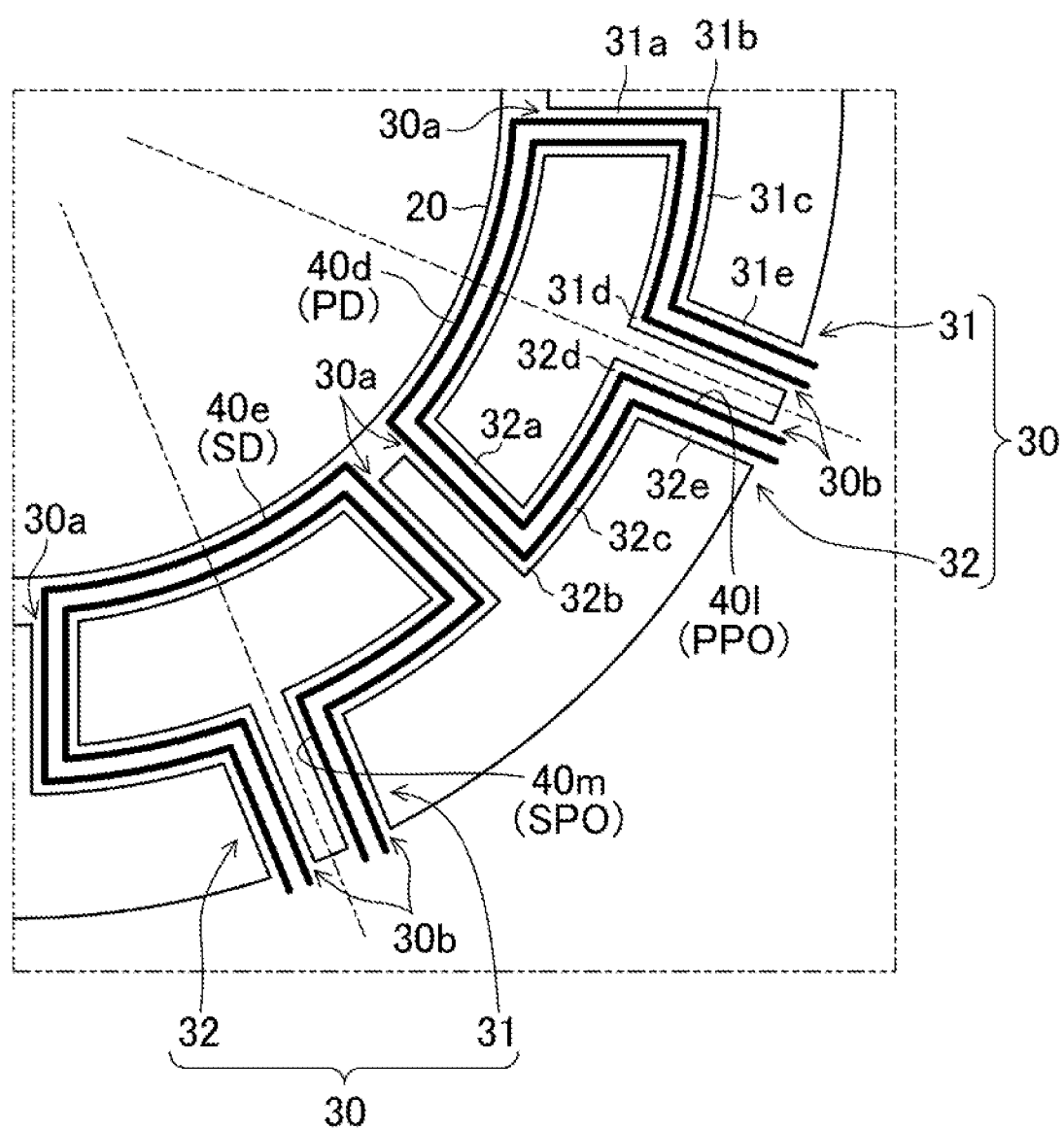
FIG. 15 is an enlarged view of a portion surrounded by a broken line in FIG. 14.
Figure 16:
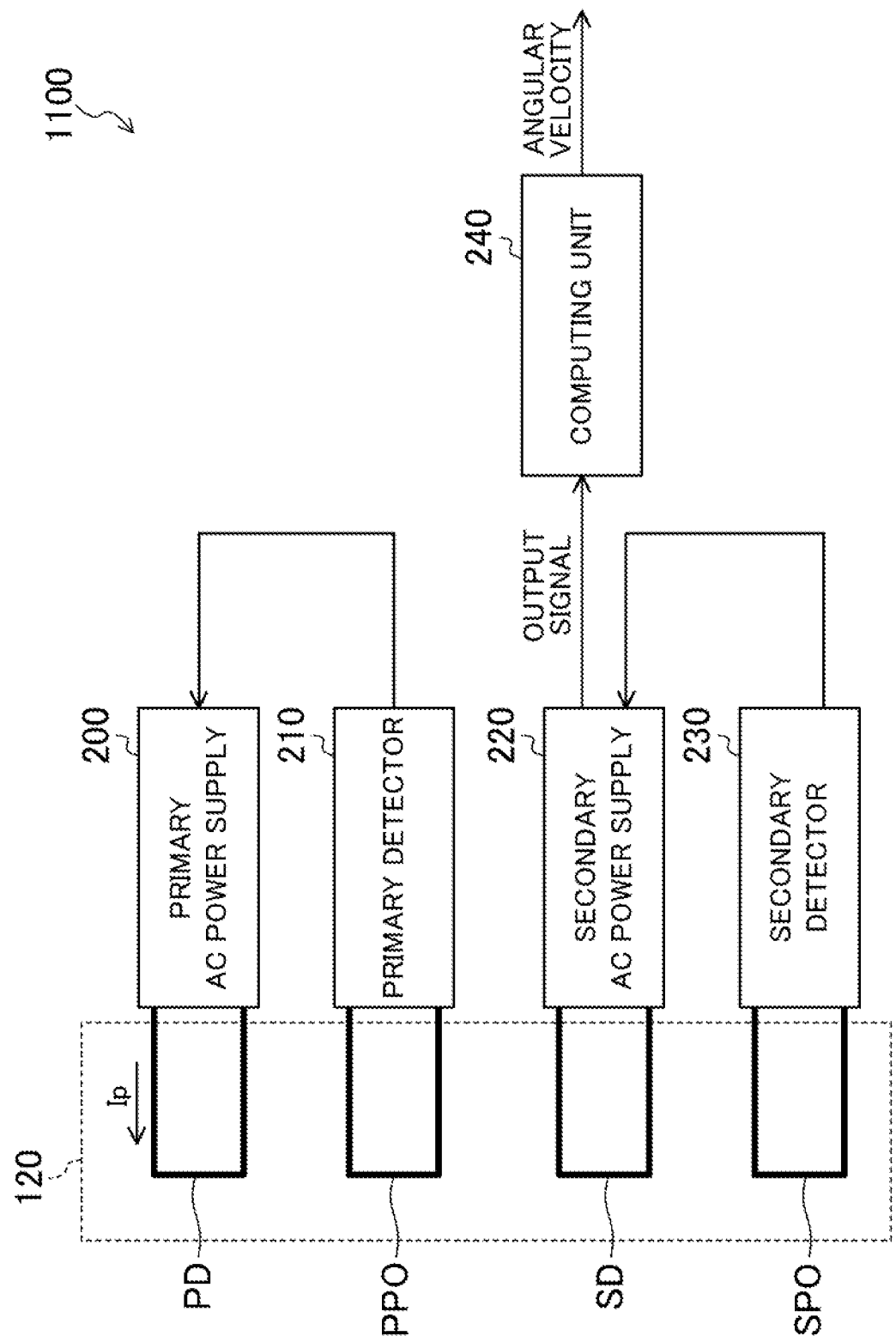
FIG. 16 is a schematic configuration diagram of a circuit block of an angular velocity sensor.

FIG. 14 shows a plan view of a vibrating-type gyroscope element according to the present embodiment, and FIG. 15 shows an enlarged view of a portion surrounded by a broken line in FIG. 14. FIG. 16 shows a schematic configuration diagram of a circuit block of an angular velocity sensor. Note that for the sake of convenience in description, only electrodes PD, PPO, SD, SPO of the vibrating-type gyroscope element 120 are schematically shown in FIG. 16 as in FIG. 4.

The vibrating-type gyroscope element 120 of the present embodiment shown in FIGS. 14 and 15 is different from the vibrating-type gyroscope element 100 described in the first embodiment in that the secondary driving electrodes SD and the primary pickoff electrodes PPO as described above are provided. Note that the number of primary driving electrodes PD, the number of secondary pickoff electrodes SPO, and the arrangement orientations of the primary driving electrodes PD and the secondary pickoff electrodes SPO are the same as those described in the first embodiment. Thus, the vibrating-type gyroscope element 120 has 16 electrodes 40*a* to 40*p*.

In the vibrating-type gyroscope element 120, the primary pickoff electrode PPO is arranged in the same orientation as that of the primary driving electrode PD, and the secondary driving electrode SD is arranged in the same orientation as that of the secondary pickoff electrode SPO. This will be further described herein.

As shown in FIG. 15, two electrodes 40*d*, 40*l* are provided in such a way that, in the plane of the support part 30 and the resonator 20, the two electrodes 40*d*, 40*l* extend in parallel with each other with a space kept therebetween. Similarly, two electrodes 40*e*, 40*m* are provided in such a way that, in the plane of the support part 30 and the resonator 20, the two electrodes 40*e*, 40*m* extend in parallel with each other with a space kept therebetween. Note that in the present Description, "parallel" includes not only a case where two members are arranged in parallel with each other, but also a case where two members are arranged in contact with each other or arranged and oriented with a space kept therebetween to such an extent that these members do not cross each other.

In the illustration of FIG. 15, of two electrodes 40*d*, 40*l* provided on the front surface of one support part 30 and arranged in parallel with each other circumferentially, the electrode 40*d* arranged outside is the primary driving electrode PD, and the electrode 40*l* arranged inside is the primary pickoff electrode PPO. Of two electrodes 40*e*, 40*m* provided on the front surface of the other support part 30 and arranged in parallel with each other circumferentially, the electrode 40*e* arranged outside is the secondary driving electrode SD, and the electrode 40*m* arranged inside is the secondary pickoff electrode SPO. In the vibrating-type gyroscope element 120, the number of pairs of the primary driving electrode PD and the primary pickoff electrode PPO and the number of pairs of the secondary driving electrode SD and the secondary pickoff electrode SPO are the same as each other.

The angular velocity sensor 1100 of the present embodiment shown in FIG. 16 is different from the angular velocity sensor 1000 described in the first embodiment in that the angular velocity sensor 1100 further has a primary detector 210 and a secondary AC power supply 220. That is, the angular velocity sensor 1100 of the present embodiment has at least the vibrating-type gyroscope element 120, a primary AC power supply 200, the primary detector 210, the secondary AC power supply 220, a secondary detector 230, and a computing unit 240.

The primary AC power supply 200 is connected to four primary driving electrodes PD. The primary detector 210 is connected to four primary pickoff electrodes PPO connected in series. The secondary AC power supply 220 is connected to four secondary driving electrodes SD. The secondary detector 230 is connected to four secondary pickoff electrodes SPO connected in series. The computing unit 240 is connected to the secondary AC power supply 220.

Operation of the angular velocity sensor 1100 will be described below.

As in the first embodiment, first order vibration of the resonator 20 in a cos 2θ mode is excited by application of an AC current Ip to the primary driving electrodes PD, and in a case where an angular velocity is generated at the resonator 20 and second order vibration is generated accordingly, a voltage signal whose level corresponds to the second order vibration is generated at the secondary pickoff electrodes SPO.

The primary pickoff electrode PPO detects the first order vibration and generates a voltage signal whose level corresponds to the amplitude of the first order vibration, and such a voltage signal is fed back to the primary detector 210. The primary detector 210 outputs an output signal to the primary AC power supply 200 based on the voltage signal generated by the primary pickoff electrode PPO. Based on the output signal from the primary detector 210, the primary AC power supply 200 is controlled, specifically in terms of the amplitude and frequency of the AC current Ip, such that the vibrational frequency and amplitude of the resonator 20 are constant.

The output signal from the secondary detector 230 is input to the secondary AC power supply 220. Based on such an output signal, the secondary AC power supply 220 drives the resonator 20 by supplying an AC current to the secondary driving electrodes SD in such a way that the second order vibration generated at the resonator 20 is canceled. Further, the secondary AC power supply 220 inputs an output signal based on the output current to the computing unit 240.

The computing unit 240 calculates the angular velocity based on the output signals from the secondary AC power supply 220.

According to the present embodiment, the voltage generated at the primary pickoff electrode PPO is detected by the primary detector 210, and the output signal from the primary detector 210 is fed back to the primary AC power supply 200. With this configuration, the first order vibration generated at the resonator 20 can be stabilized.

The voltage generated at the secondary pickoff electrode SPO is detected by the secondary detector 230, and based on the output signal from the secondary detector 230, the output of the secondary AC power supply 220 is controlled such that the second order vibration generated at the resonator 20 is canceled. With this configuration, the vibration state of the resonator 20 can be stabilized. Also, with this configuration, the noise component included in the output signal from the secondary AC power supply 220 can be reduced, and the accuracy of detection of the angular velocity can be enhanced.

The vibrating-type gyroscope element 120 of the present embodiment is the same as the vibrating-type gyroscope element 100 described in the first embodiment in terms of the arrangement of the primary driving electrodes PD and the secondary pickoff electrodes SPO and the relationship of connections thereamong. That is, the vibrating-type gyroscope element 120 and the angular velocity sensor 1100 of the present embodiment can provide advantages similar to those of the configuration described in the first embodiment. That is, a crosstalk voltage included in a voltage generated at the secondary pickoff electrode SPO during operation of the vibrating-type gyroscope element 120 can be reduced. Moreover, a crosstalk voltage included in an output signal from the vibrating-type gyroscope element 120 can be reduced, and the accuracy of detection of the angular velocity can be enhanced.

In the vibrating-type gyroscope element 120 of the present embodiment, the secondary driving electrode SD is arranged in the orientation between the orientation in which the primary driving electrode PD is arranged and the orientation in which the secondary pickoff electrode SPO is arranged, as shown in FIG. 15. With this configuration, a mutual inductance between the primary driving electrode PD and the secondary pickoff electrode SPO can be decreased, and the level of the crosstalk voltage generated at the secondary pickoff electrode SPO can be reduced.

Note that arrangement of the electrodes PD, PPO, SD, SPO each provided on the support parts 30 is not particularly limited to those in the examples shown in FIGS. 14 and 15. Although not shown, for example, it may be so configured that the primary pickoff electrode PPO is arranged outside while the primary driving electrode PD is arranged inside. With this configuration, the primary pickoff electrode PPO and the secondary driving electrode SD are arranged between the primary driving electrode PD and the secondary pickoff electrode SPO, so that the level of the crosstalk voltage generated at the secondary pickoff electrode SPO can be further reduced.

Note that as in the first embodiment, four secondary pickoff electrodes SPO are connected in series so that a high S/N ratio of the output signal from the secondary detector 230 can be obtained and the accuracy of detection of the angular velocity calculated by the computing unit 240 can be enhanced.

For a similar reason, four primary pickoff electrodes PPO may be connected in series, preferably.

Other Embodiments

The components described in the first and second embodiments and each modification may be combined to create a new embodiment.

For example, the primary pickoff electrode PPO and the secondary driving electrode SD described in the second embodiment may be applied to the vibrating-type gyroscope element 100 described in the first to fifth modifications. In this case, the primary driving electrode PD and the primary pickoff electrode PPO are provided in such a way that, in the plane of the support part 30 and the resonator 20, these electrodes PD, PPO extend in parallel with each other with a space kept therebetween, needless to say. Similarly, the secondary driving electrode SD and the secondary pickoff electrode SPO are provided in such a way that, in the plane of the support part 30 and the resonator 20, these electrodes SD, SPO extend in parallel with each other with a space kept therebetween.

Note that in the second embodiment, the example where the primary driving electrode PD and the primary pickoff electrode PPO are arranged in parallel with each other on the front surfaces of the resonator 20 and the support part 30 has been described. However, the present disclosure is not limited to these, and, for example, the primary driving electrode PD and the primary pickoff electrode PPO may be arranged in parallel with each other with a space kept therebetween in a thickness direction of the resonator 20 and the support part 30. More specifically, one of the primary driving electrode PD or the primary pickoff electrode PPO may be provided on the front surfaces of the resonator 20 and the support part 30, and the other one of the primary driving electrode PD or the primary pickoff electrode PPO may be provided on the back surfaces of the resonator 20 and the support part 30. Similarly, the secondary driving electrode SD and the secondary pickoff electrode SPO may be arranged in parallel with each other with a space kept therebetween in the thickness direction of the resonator 20 and the support part 30. That is, one of the secondary driving electrode SD or the secondary pickoff electrode SPO may be provided on the front surfaces of the resonator 20 and the support part 30, and the other one of the secondary driving electrode SD or the secondary pickoff electrode SPO may be provided on the back surfaces of the resonator 20 and the support part 30. In addition, these electrodes may be arranged inside the resonator 20 and the support part 30.

Note that the resonator 20 may only be required to be in such a shape that the first order vibration is excitable with the shape and the vibration state of the shape changes when the angular velocity is generated, and therefore the resonator 20 is not limited particularly to the circular ring shape. For example, the resonator 20 may be in a regular polygonal ring shape or a discoid shape. The resonator 20 may also be in a hemispherical shape.

The support part 30 may only be required to connect the resonator 20 to the fixed part 10 without interference with vibration of the resonator 20, and the shape thereof is not limited to that shown in FIGS. 1 and 3.

Note that the plurality of secondary pickoff electrodes SPO is not necessarily connected in series and voltages generated thereat may be input to the computing unit 240 and be added up in the computing unit 240. Similarly, the plurality of primary pickoff electrodes PPO is not necessarily connected in series and voltages generated thereat may be input to the not-shown computing unit 240, be added up in the computing unit 240, and be input to the primary AC power supply 200.

According to the vibrating-type gyroscope element of the present disclosure, the crosstalk voltage generated at the secondary pickoff electrode during operation can be reduced, and therefore, such a vibrating-type gyroscope element is useful in application to a high-accuracy angular velocity sensor.

The invention claimed is:

1. A vibrating-type gyroscope element, comprising at least:
    a fixed part,
    a resonator,
    a plurality of support parts connecting the resonator to the fixed part and vibratably supporting the resonator, at least 4N electrodes formed in a plane of the resonator, where N is a natural number of two or more, and a magnetic field applier that applies a magnetic field to the at least 4N electrodes in a direction crossing a front surface of the resonator, the resonator having a cos Nθ mode of vibration, at least one of the electrodes being arranged in each of 4N orientations, where axes of the electrodes are arranged at equiangular intervals in an outer circumferential direction of the resonator, the electrodes including at least two primary driving electrodes that excite first order vibration of the resonator in the cos Nθ mode and at least two secondary pickoff electrodes that detect second order vibration of the resonator, wherein:

$$\text{a relationship of } U \geq 1 \text{ or} \quad (1)$$

$$(S1 + S2) - 2 \geq |S1 - S2| \quad (2)$$

and
a relationship of S1=S2
are satisfied, where S1 is the number of cases where a primary driving electrode is arranged in an orientation adjacent to a clockwise side of a secondary pickoff electrode, S2 is the number of cases where a primary driving electrode is arranged in an orientation adjacent to a counterclockwise side of a secondary pickoff electrode, and U is the number of secondary pickoff electrodes that a primary driving electrode is not arranged in an orientation adjacent to either the clockwise or counterclockwise side thereof.

2. The vibrating-type gyroscope element of claim 1, wherein:

the number of the electrodes is 8N, two of the 8N electrodes are arranged in each of the 4N orientations, the electrodes include:

at least two primary pickoff electrodes that detect the first order vibration; and at least two secondary driving electrodes that drive the resonator such that the second order vibration is canceled, the primary pickoff electrodes, the number of which is the same as that of the primary driving electrodes, are arranged in orientations identical to those of the primary driving electrodes, respectively, and the secondary driving electrodes, the number of which is same as that of the secondary pickoff electrodes, are arranged in orientations identical to those of the secondary pickoff electrodes, respectively.

3. An angular velocity sensor, comprising at least:

the vibrating-type gyroscope element of claim 2;

a primary AC power supply that applies an AC current with a predetermined frequency to the primary driving electrode;

a primary detector that detects a voltage signal generated at the primary pickoff electrode, a secondary AC power supply that applies an AC current to the secondary driving electrode;

a secondary detector that detects a voltage signal generated at the secondary pickoff electrode, and a computing unit that calculates an angular velocity based on an output signal from the secondary AC power supply.

4. The angular velocity sensor of claim 3, wherein an output signal from the primary detector is fed back to the primary AC power supply, so as to stabilize the first order vibration generated at the resonator, based on an output signal from the secondary detector, an output of the secondary AC power supply is controlled such that the second order vibration generated at the resonator is canceled, and the computing unit calculates the angular velocity based on the output signal from the secondary AC power supply.

5. An angular velocity sensor, comprising at least:

the vibrating-type gyroscope element of claim 1;

a primary AC power supply that applies an AC current with a predetermined frequency to the primary driving electrode;

a secondary detector that detects a voltage signal generated at the secondary pickoff electrode, and a computing unit that calculates an angular velocity based on an output signal from the secondary detector.

* * * * *